US012165580B2

(12) United States Patent
Toyotaka et al.

(10) Patent No.: US 12,165,580 B2
(45) Date of Patent: Dec. 10, 2024

(54) DISPLAY PANEL, DISPLAY DEVICE, INPUT/OUTPUT DEVICE, AND DATA PROCESSING DEVICE

(71) Applicant: Semiconductor Energy Laboratory Co., Ltd., Kanagawa-ken (JP)

(72) Inventors: Kouhei Toyotaka, Kanagawa (JP); Daiki Nakamura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 18/531,931

(22) Filed: Dec. 7, 2023

(65) Prior Publication Data

US 2024/0112629 A1 Apr. 4, 2024

Related U.S. Application Data

(63) Continuation of application No. 16/964,735, filed as application No. PCT/IB2019/050369 on Jan. 17, 2019, now Pat. No. 11,842,679.

(30) Foreign Application Priority Data

Jan. 30, 2018 (JP) ................................ 2018-013242

(51) Int. Cl.
*G09G 3/32* (2016.01)
*G09G 3/3225* (2016.01)
(Continued)

(52) U.S. Cl.
CPC ........... *G09G 3/3225* (2013.01); *H10K 50/86* (2023.02); *H10K 50/865* (2023.02);
(Continued)

(58) Field of Classification Search
CPC .............. G09G 3/3225; G09G 3/2007; G09G 2300/0426; G09G 2300/0439;
(Continued)

(56) References Cited

U.S. PATENT DOCUMENTS 7,944,141 B2 5/2011 Sagawa et al.
8,363,191 B2 1/2013 Yoshida
(Continued)

FOREIGN PATENT DOCUMENTS

CN 101436610 A 5/2009
CN 101536064 A 9/2009
(Continued)

OTHER PUBLICATIONS

International Search Report (Application No. PCT/IB2019/050369) Dated May 7, 2019.
(Continued)

*Primary Examiner* — Pegeman Karimi
(74) *Attorney, Agent, or Firm* — Husch Blackwell LLP

(57) ABSTRACT

A novel display panel that is highly convenient or reliable is provided. The display panel includes a display region, a first functional layer, and a second functional layer. The display region includes a pixel, and the pixel includes a display element and a pixel circuit. The first functional layer includes the pixel circuit, a scan line, and a first connection portion. The display element is electrically connected to the pixel circuit, and the pixel circuit is electrically connected to the scan line. The second functional layer includes a region overlapping with the first functional layer, the second functional layer includes a driver circuit and a wiring, and the driver circuit is provided so that the pixel circuit is positioned between the driver circuit and the display element. The wiring is electrically connected to the scan line at the first connection portion, and the wiring is electrically connected to the driver circuit.

6 Claims, 17 Drawing Sheets

(51) Int. Cl.
| | |
|---|---|
| *H10K 50/86* | (2023.01) |
| *H10K 59/131* | (2023.01) |
| *H10K 59/38* | (2023.01) |
| *H10K 59/40* | (2023.01) |
| *G06F 3/01* | (2006.01) |
| *G06F 3/02* | (2006.01) |
| *G06F 3/0354* | (2013.01) |
| *G06F 3/041* | (2006.01) |
| *G09G 3/20* | (2006.01) |

(52) U.S. Cl.
CPC ........... *H10K 59/131* (2023.02); *H10K 59/38* (2023.02); *H10K 59/40* (2023.02); *G06F 3/013* (2013.01); *G06F 3/02* (2013.01); *G06F 3/03545* (2013.01); *G06F 3/041* (2013.01); *G09G 3/2007* (2013.01); *G09G 2300/0426* (2013.01); *G09G 2300/0439* (2013.01); *G09G 2310/0286* (2013.01); *G09G 2310/08* (2013.01); *G09G 2320/0233* (2013.01); *G09G 2320/0247* (2013.01); *G09G 2330/021* (2013.01); *G09G 2354/00* (2013.01)

(58) Field of Classification Search
CPC ....... G09G 2310/0286; G09G 2310/08; G09G 2320/0233; G09G 2320/0247; G09G 2330/021; G09G 2354/00; G09G 3/3266; G09G 2310/0281; G09G 2320/0626; G09G 2320/0666; G09G 2340/0435; G09G 2360/144; G09G 2380/02; G09G 3/32; G09G 3/3208; H10K 50/86; H10K 50/865; H10K 59/131; H10K 59/38; H10K 59/40; H10K 59/12; G06F 3/013; G06F 3/02; G06F 3/03545; G06F 3/041; G06F 3/0446; G09F 9/00; G09F 9/30; G09F 9/33; H05B 33/06; H05B 33/14; H01L 27/124; H01L 27/1255
See application file for complete search history.

(56) References Cited

U.S. PATENT DOCUMENTS

| | | | |
|---|---|---|---|
| 9,244,316 B2 | 1/2016 | Nishino et al. | |
| 9,941,340 B2 | 4/2018 | Lee et al. | |
| 10,181,295 B2 | 1/2019 | Hirakata | |
| 10,191,344 B2 | 1/2019 | Noma et al. | |
| 10,429,999 B2 | 10/2019 | Jinbo et al. | |
| 10,490,122 B2 | 11/2019 | Kim et al. | |
| 10,546,516 B2 | 1/2020 | Tomoda et al. | |
| 10,620,483 B2 | 4/2020 | Nakanishi et al. | |
| 10,634,968 B2 | 4/2020 | Noma et al. | |
| 10,976,872 B2 | 4/2021 | Jinbo et al. | |
| 11,183,112 B2 | 11/2021 | Kim et al. | |
| 2002/0071082 A1 | 6/2002 | Okita et al. | |
| 2005/0211986 A1 | 9/2005 | Konno et al. | |
| 2006/0055643 A1* | 3/2006 | Sato | H10K 50/841 345/82 |
| 2010/0156945 A1 | 6/2010 | Yoshida | |
| 2012/0200557 A1* | 8/2012 | Sato | G09G 3/3275 345/212 |
| 2013/0063406 A1 | 3/2013 | Nishino et al. | |
| 2014/0354613 A1 | 12/2014 | Kim et al. | |
| 2016/0097949 A1 | 4/2016 | Nishino et al. | |
| 2016/0300853 A1 | 10/2016 | Yamazaki | |
| 2017/0140679 A1 | 5/2017 | Tomoda et al. | |
| 2017/0249896 A1 | 8/2017 | Kim et al. | |
| 2017/0261828 A1 | 9/2017 | Noma et al. | |
| 2017/0269440 A1* | 9/2017 | Yoshitomi | G06F 3/0446 |
| 2017/0315644 A1* | 11/2017 | Hayakawa | H01Q 1/48 |
| 2017/0338252 A1 | 11/2017 | Lee et al. | |
| 2018/0012549 A1* | 1/2018 | Lee | G09G 3/3266 |
| 2018/0197885 A1 | 7/2018 | Lee et al. | |
| 2019/0033638 A1 | 1/2019 | Nakanishi et al. | |
| 2020/0272270 A1 | 8/2020 | Kim et al. | |

FOREIGN PATENT DOCUMENTS

| | | |
|---|---|---|
| CN | 102998820 A | 3/2013 |
| CN | 106133812 A | 11/2016 |
| CN | 107003581 A | 8/2017 |
| CN | 107134473 A | 9/2017 |
| CN | 107403804 A | 11/2017 |
| CN | 107579075 A | 1/2018 |
| CN | 108885363 A | 11/2018 |
| DE | 2731717 | 2/1978 |
| EP | 2085952 A | 8/2009 |
| EP | 3128503 A | 2/2017 |
| EP | 3211671 A | 8/2017 |
| GB | 1585394 | 3/1981 |
| JP | 53-018999 A | 2/1978 |
| JP | 2000-206565 A | 7/2000 |
| JP | 2002-334778 A | 11/2002 |
| JP | 2008/062575 | 3/2010 |
| JP | 4659885 | 3/2011 |
| JP | 5318999 | 10/2013 |
| KR | 2016-0140614 A | 12/2016 |
| TW | 201621850 | 6/2016 |
| TW | 201725495 | 7/2017 |
| TW | 201734739 | 10/2017 |
| TW | 201742437 | 12/2017 |
| WO | WO-2007/032313 | 3/2007 |
| WO | WO-2008/062575 | 5/2008 |
| WO | WO-2015/151648 | 10/2015 |
| WO | WO-2016/080498 | 5/2016 |
| WO | WO-2017/068454 | 4/2017 |
| WO | WO-2017/103737 | 6/2017 |
| WO | WO-2017/170099 | 10/2017 |
| WO | WO-2017/187292 | 11/2017 |

OTHER PUBLICATIONS

Written Opinion (Application No. PCT/IB2019/050369) Dated May 7, 2019.
Chinese Office Action (Application No. 201980009872.5) Dated May 6, 2022.
Taiwanese Office Action (Application No. 108101738) Dated Sep. 8, 2022.

* cited by examiner

FIG. 15A (Scan line G1)
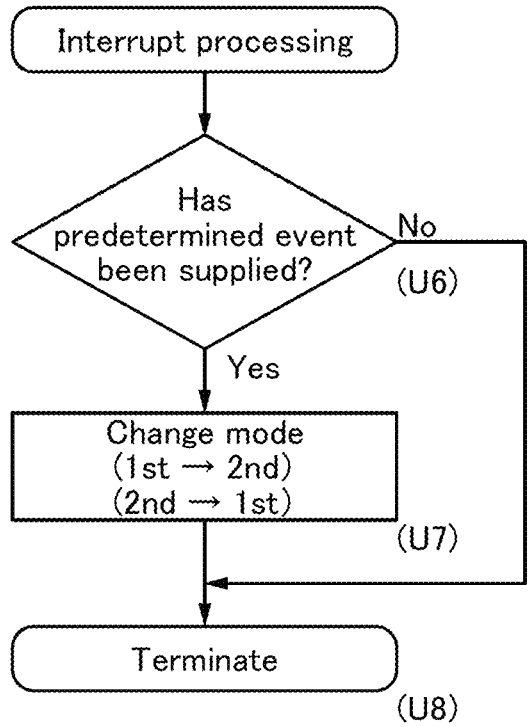
FIG. 15B
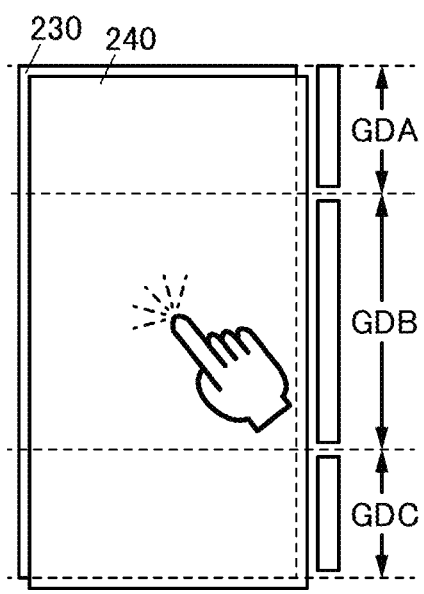
FIG. 15C
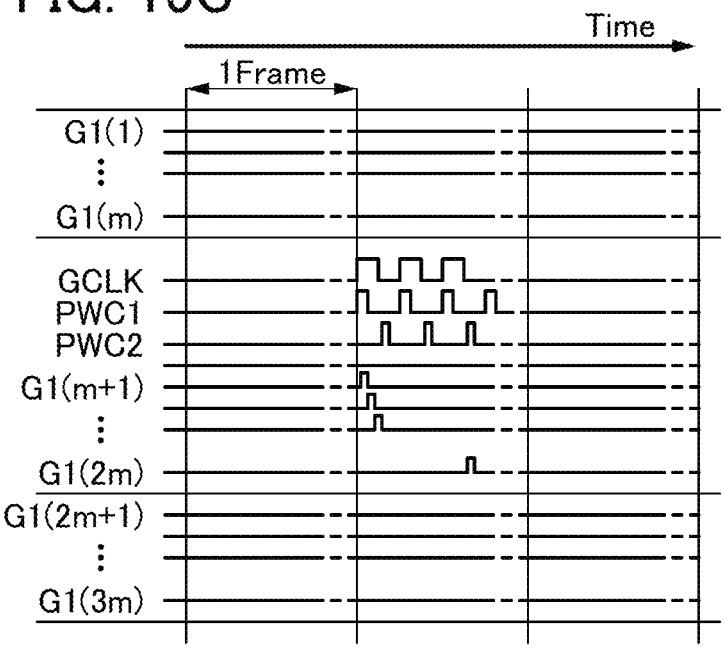

DISPLAY PANEL, DISPLAY DEVICE, INPUT/OUTPUT DEVICE, AND DATA PROCESSING DEVICE

This application is a continuation of copending U.S. application Ser. No. 16/964,735, filed on Jul. 24, 2023 which is a 371 of international application PCT/IB2019/050369 filed on Jan. 17, 2019, which are all incorporated herein by reference.

TECHNICAL FIELD

One embodiment of the present invention relates to a display panel, a display device, an input/output device, or a data processing device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a semiconductor device, a display device, a light-emitting device, a power storage device, a memory device, a driving method thereof, and a manufacturing method thereof.

BACKGROUND ART

A display device which includes a display region and a terminal electrode that overlap with each other and is electrically connected to an external electrode on the non-display surface side of the display region is known (Patent Document 1).

Furthermore, a display device which includes a display part having a flexible panel substrate serving as a display screen and display elements disposed lengthwise and breadthwise on a surface opposite to a surface serving as the display screen of the panel substrate; and driving circuit parts is known, where the driving circuit parts have flexible driving circuit substrates on which semiconductor elements made of flexible semiconductor materials are mounted (Patent Document 2).

REFERENCE

Patent Document

[Patent Document 1] United States Patent Application Publication No. 2016/0300853
[Patent Document 2] United States Patent Application Publication No. 2002/0071082

SUMMARY OF THE INVENTION

Problems to be Solved by the Invention

An object of one embodiment of the present invention is to provide a novel display panel that is highly convenient or reliable. Alternatively, an object is to provide a novel display device that is highly convenient or reliable. Alternatively, an object is to provide a novel input/output device that is highly convenient or reliable. Alternatively, an object is to provide a novel data processing device that is highly convenient or reliable. Alternatively, an object is to provide a novel display panel, a novel display device, a novel input/output device, a novel data processing device, or a novel semiconductor device.

Note that the description of these objects does not disturb the existence of other objects. One embodiment of the present invention does not need to achieve all of these objects. Other objects will be apparent from and can be derived from the description of the specification, the drawings, the claims, and the like.

Means for Solving the Problems (1) One embodiment of the present invention is a display panel 700 which includes a display region 231, a first functional layer 520A, a second functional layer 520B, and a first connection portion 591C(i, y).

The display region 231 includes a pixel 702($i, j$). The pixel 702($i, j$) includes a display element 550($i, j$) and a pixel circuit 530($i, j$).

The first functional layer 520A includes the pixel circuit 530($i, j$) and a scan line G1($i$), and the display element 550($i, j$) is electrically connected to the pixel circuit 530($i, j$).

The pixel circuit 530($i, j$) is electrically connected to the scan line G1($i$).

The second functional layer 520B includes a region overlapping with the first functional layer 520A, and the second functional layer 520B includes a driver circuit GD and a wiring G2($i$).

The driver circuit GD is provided so that the pixel circuit 530($i, j$) is positioned between the driver circuit GD and the display element 550($i, j$).

The wiring G2($i$) is electrically connected to the scan line G1($i$) at the first connection portion 591C(i, y), and the wiring G2($i$) is electrically connected to the driver circuit GD.

Thus, the flexibility in the layout of the driver circuit GD can be increased. For example, the driver circuit GD can be provided so as to overlap with the display region 231. Alternatively, an outward form of the driver circuit GD does not have to be formed along an outward form of the display panel 700. Alternatively, the freedom of the outward form of the display panel 700 can be increased. For example, a curved line can be contained in the contours of the display region 231. Alternatively, the outward form of the display panel 700 can be made small. As a result, a novel display panel that is highly convenient or reliable can be provided.

(2) One embodiment of the present invention is the above-described display panel 700 including a terminal 519C(j).

The first functional layer 520A includes a signal line S1($j$), an auxiliary signal line S2($j$), and a second connection portion 591D(j).

The signal line S1($j$) is electrically connected to the pixel circuit 530($i, j$), and the signal line S1($j$) is electrically connected to the auxiliary signal line S2($j$) at the second connection portion 591D(j).

The auxiliary signal line S2($j$) includes a region intersecting another signal line S1($j$+1), and the auxiliary signal line S2($j$) is electrically connected to the terminal 519C(j).

Thus, the flexibility in the layout of the terminal 519C(j) can be increased. Alternatively, the freedom of the outward form of the display panel 700 can be increased. Alternatively, the outward form of the display panel 700 can be made small. As a result, a novel display panel that is highly convenient or reliable can be provided.

(3) One embodiment of the present invention is the above-described display panel, in which the display region 231 includes one scan line G1(i) and another scan line G1(p) which is electrically connected to pixels fewer than pixels to which the scan line G1(i) is electrically connected to.

(4) One embodiment of the present invention is the above-described display panel, in which the display region 231 includes one signal line S1(j) and another signal line S1(q) which is electrically connected to pixels fewer than pixels to which the signal line S1(j) is electrically connected to.

Thus, the freedom of the outward form of the display panel 700 can be increased. For example, a curved line can be contained in the contours of the display region 231. Alternatively, the outward form of the display panel can be formed along the display region having a curved line. Alternatively, for example, pixels can be arranged along a curved line. As a result, a novel display panel that is highly convenient or reliable can be provided.

(5) One embodiment of the present invention is the above-described display panel in which the display region 231 includes a group of pixels 702(i, 1) to 702(i, n) and a different group of pixels 702(1, j) to 702(m, j).

The group of pixels 702(i, 1) to 702(i, n) include the pixel 702(i, j), and the group of pixels 702(i, 1) to 702(i, n) are provided in a row direction. Furthermore, the group of pixels 702(i, 1) to 702(i, n) are electrically connected to the scan line G1(i).

The different group of pixels 702(1, j) to 702(m, j) include the pixel 702(i, j), and the different group of pixels 702(1, j) to 702(m, j) are provided in a column direction intersecting the row direction. Furthermore, the different group of pixels 702(1, j) to 702(m, j) are electrically connected to the signal line S1(j).

Thus, image data can be supplied to a plurality of pixels. As a result, a novel display panel that is highly convenient or reliable can be provided.

(6) One embodiment of the present invention is the above-described display panel which includes a group of connection portions 591C(i, 1) to 591C(i, h). Note that h is a natural number greater than or equal to 1, preferably greater than 1 and smaller than n.

The group of connection portions 591C(i, 1) to 591C(i, h) include the first connection portion 591C(i, y), and the scan line G1(i) is electrically connected to the wiring G2(i) at the group of connection portions 591C(i, 1) to 591C(i, h).

Thus, the scan line G1(i) can be electrically connected to the wiring G2(i). Alternatively, the probability of occurrence of connection defects can be reduced. As a result, a novel display panel that is highly convenient or reliable can be provided.

(7) One embodiment of the present invention is the above-described display panel 700 in which the first connection portion 591C(i, y) includes a conductive member CP, and the conductive member CP has a function of electrically connecting the scan line G1(i) and the wiring G2(i).

Thus, the scan line G1(i) can be electrically connected to the wiring G2(i). Alternatively, the probability of occurrence of connection defects can be reduced. As a result, a novel display panel that is highly convenient or reliable can be provided.

(8) One embodiment of the present invention is the display device including the above-described display panel 700 and a control portion 238.

The control portion 238 is supplied with image data V1 and control data CI. The control portion 238 generates data V11 on the basis of the image data V1, and the control portion 238 generates a control signal SP on the basis of the control data CI. Furthermore, the control portion 238 supplies the data V11 and the control signal SP.

The display panel 700 is supplied with the data V11 and the control signal SP. Note that the driver circuit GD operates on the basis of the control signal SP, and the pixel 702(i, j) performs display on the basis of the data V11.

Thus, the image data can be displayed using the display element. As a result, a novel display device that is highly convenient or reliable can be provided.

(9) Furthermore, one embodiment of the present invention is an input/output device that includes an input portion 240 and a display portion 230.

The display portion 230 includes the above-described display panel 700, and the input portion 240 includes a sensing region 241.

The input portion 270 senses an object approaching the sensing region 241, and the sensing region 241 includes a region overlapping with the pixel 702(i, j).

Thus, the object approaching the region overlapping with the display portion can be sensed while image data is displayed using the display portion. Alternatively, positional data can be input using a finger or the like that approaches the display portion as a pointer. Alternatively, positional data can be associated with image data displayed on the display portion. As a result, a novel input/output device that is highly convenient or reliable can be provided.

(10) Furthermore, one embodiment of the present invention is a data processing device that includes one or more of a keyboard, a hardware button, a pointing device, a touch sensor, an illuminance sensor, an imaging device, an audio input device, an eye-gaze input device, and an attitude detection device, and the above-described display panel.

Thus, an arithmetic device can generate image data or control data on the basis of data supplied using a variety of input devices. As a result, a novel data processing device that is highly convenient or reliable can be provided.

Although the block diagram in which components are classified by their functions and shown as independent blocks is shown in the drawings attached to this specification, it is difficult to completely divide actual components according to their functions and one component can relate to a plurality of functions.

In this specification, the names of a source and a drain of a transistor interchange with each other depending on the polarity of the transistor and the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, for the sake of convenience, the connection relation of a transistor is sometimes described assuming that the source and the drain are fixed; in reality, the names of the source and the drain interchange with each other according to the above relation of the potentials.

In this specification, a source of a transistor means a source region that is part of a semiconductor film functioning as an active layer or a source electrode connected to the above-described semiconductor film. Similarly, a drain of a transistor means a drain region that is part of the above-described semiconductor film or a drain electrode connected to the semiconductor film. Moreover, a gate means a gate electrode.

In this specification, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, connection means electrical connection and corresponds to a state in which a current, a voltage, or a potential can be supplied or transmitted. Accordingly, a state of being connected does not necessarily mean a state of being directly connected and also includes, in its category, a state of being indirectly connected through a circuit element such as a wiring, a resistor, a diode, or a transistor that allows a current, a voltage, or a potential to be supplied or transmitted.

In this specification, even when independent components are connected to each other in a circuit diagram, there is actually a case where one conductive film has functions of a plurality of components such as a case where part of a wiring functions as an electrode, for example.

Connection in this specification also includes such a case where one conductive film has functions of a plurality of components, in its category.

Furthermore, in this specification, one of a first electrode and a second electrode of a transistor refers to a source electrode and the other refers to a drain electrode.

Effect of the Invention

With one embodiment of the present invention, a novel display panel that is highly convenient or reliable can be provided. Alternatively, a novel display device that is highly convenient or reliable can be provided. Alternatively, a novel input/output device that is highly convenient or reliable can be provided. Alternatively, a novel data processing device that is highly convenient or reliable can be provided. Alternatively, a novel display panel, a novel display device, a novel input/output device, a novel data processing device, or a novel semiconductor device can be provided.

Note that the description of these effects does not disturb the existence of other effects. One embodiment of the present invention does not need to have all of these effects. Other effects will be apparent from and can be derived from the description of the specification, the drawings, the claims, and the like.

BRIEF DESCRIPTION OF THE DRAWINGS

FIGS. 11A-11B3 are views showing a display device of an embodiment.

FIGS. 15A-15C are views showing an input/output device of an embodiment.

MODE FOR CARRYING OUT THE INVENTION

Figure 1A:
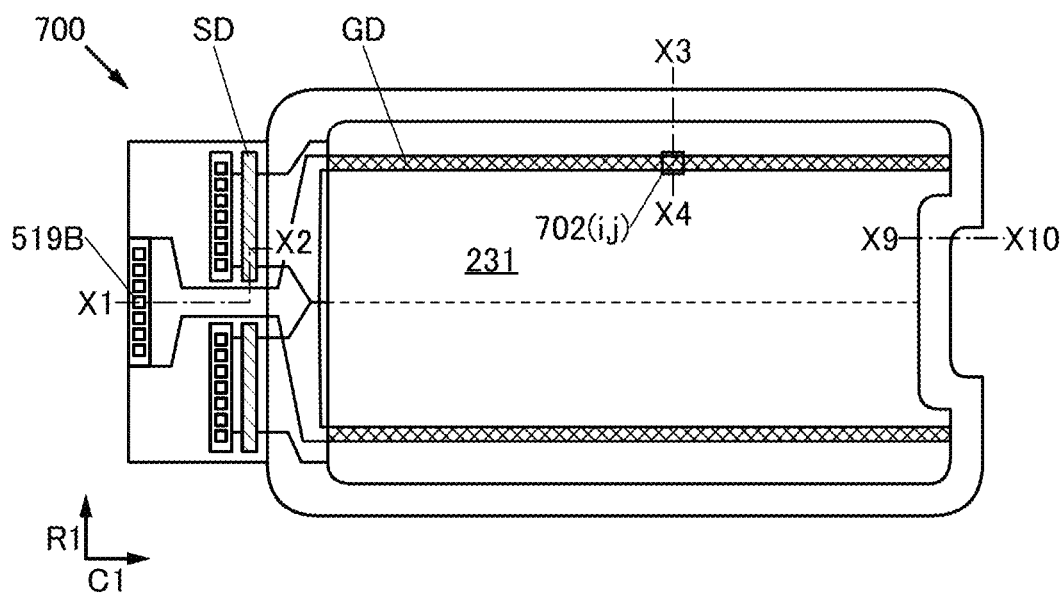
FIGS. 1A and 1B are views showing a structure of a display panel of an embodiment.

One embodiment of the present invention is a display panel including a display region, a first functional layer, a second functional layer, and a first connection portion. The display region includes a pixel, and the pixel includes a display element and a pixel circuit. The first functional layer includes the pixel circuit and a scan line, the display element is electrically connected to the pixel circuit, and the pixel circuit is electrically connected to the scan line. The second functional layer includes a region overlapping with the first functional layer, the second functional layer includes a driver circuit and a wiring, and the driver circuit is provided so that the pixel circuit is positioned between the driver circuit and the display element. The wiring is electrically connected to the scan line at the first connection portion, and the wiring is electrically connected to the driver circuit.

Thus, the flexibility in the layout of the driver circuit can be increased. For example, the driver circuit can be provided so as to overlap with the display region. Alternatively, the freedom of the outward form of the display panel can be increased. For example, a curved line can be contained in the contours of the display region. Alternatively, the outward form of the display panel can be made small. As a result, a novel display panel that is highly convenient or reliable can be provided.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description of the following embodiments. Note that in structures of the invention described below, the same portions or portions having similar functions are denoted by the same reference numerals in different drawings, and a description thereof is not repeated.

Embodiment 1

In this embodiment, structures of a display panel of one embodiment of the present invention will be described with reference to FIG. 1 to FIG. 9.

Figure 1B:
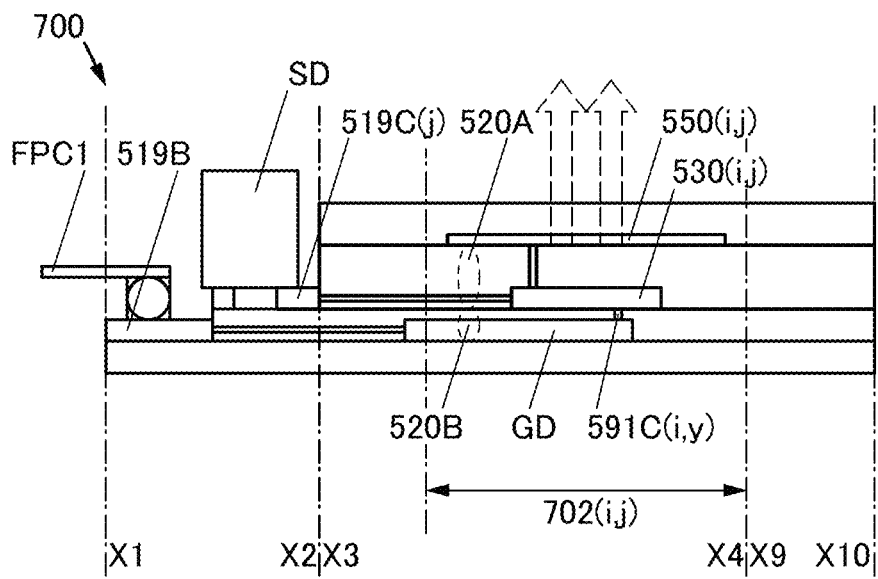

FIG. 1 shows a structure of the display panel of one embodiment of the present invention. FIG. 1(A) is a top view of the display panel of one embodiment of the present invention, and FIG. 1(B) is a cross-sectional view taken along cutting plane lines X1-X2, X3-X4, and X9-X10 in FIG. 1(A).

Figure 2A:
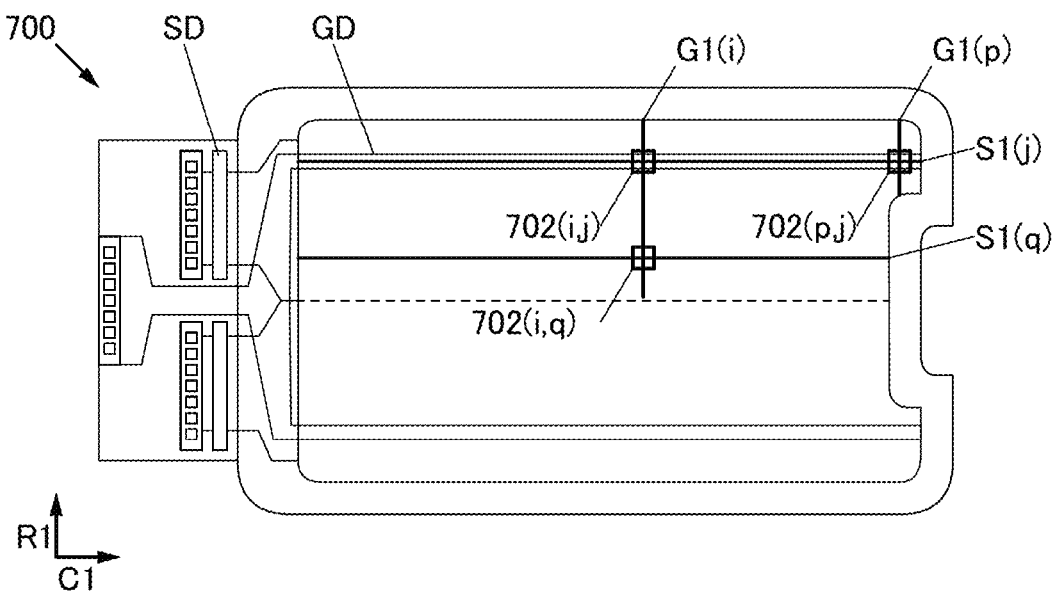
FIGS. 2A and 2B are views showing a structure of a display panel of an embodiment.
Figure 2B:
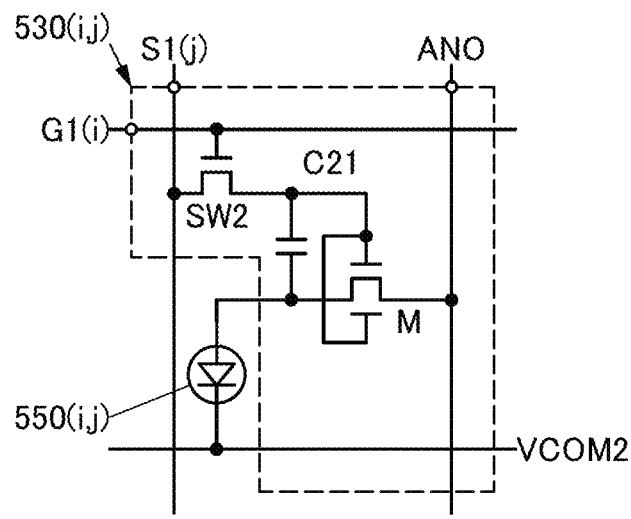

FIG. 2 shows a structure of the display panel of one embodiment of the present invention. FIG. 2(A) is a schematic diagram of the display panel of one embodiment of the present invention, and FIG. 2(B) shows a pixel circuit for explaining the pixel 702(i, j) in FIG. 2(A).

Figure 3A:
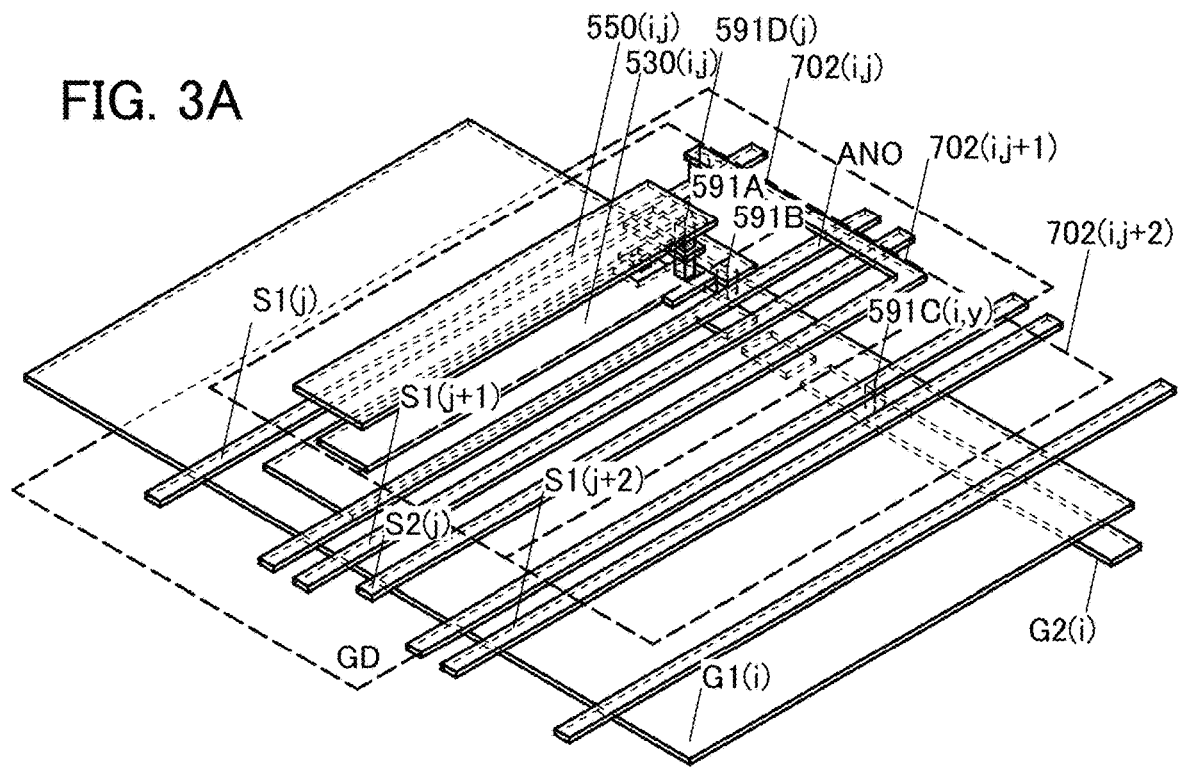
FIGS. 3A and 3B are views showing a structure of a display panel of an embodiment.
Figure 3B:
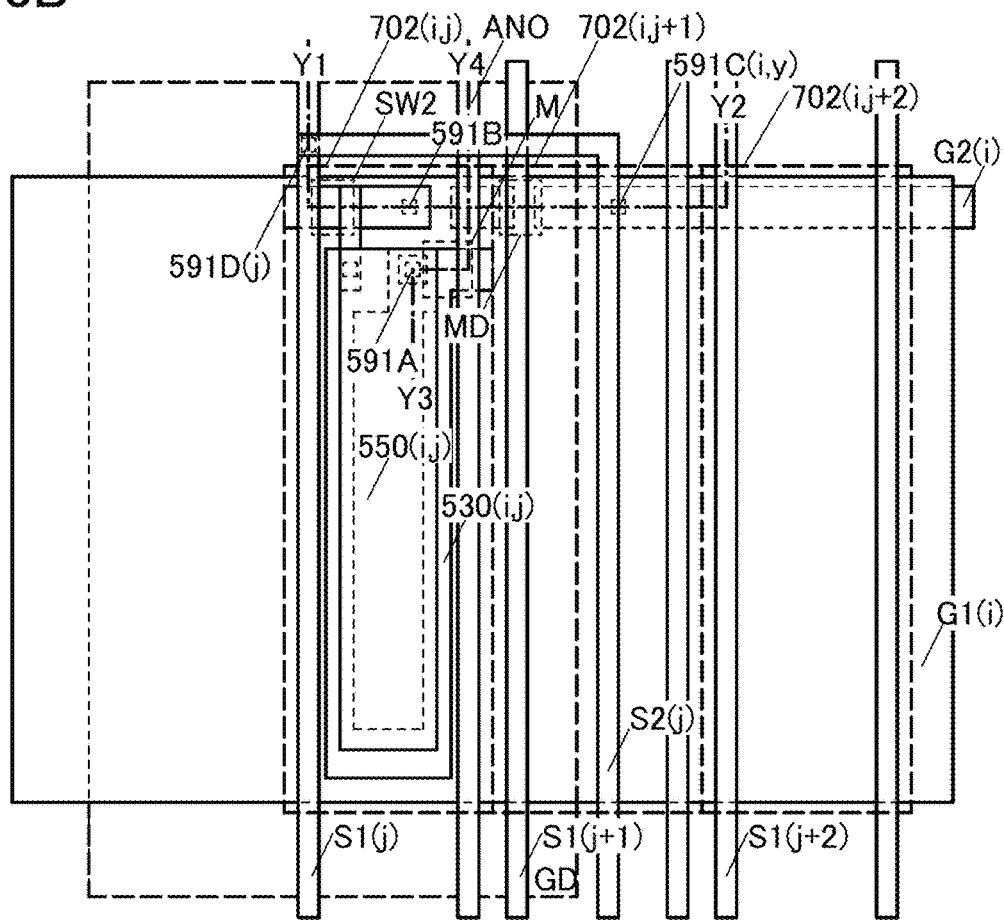

FIG. 3 shows a structure of the display panel of one embodiment of the present invention. FIG. 3(A) is a perspective view of part of the display panel of one embodiment of the present invention, and FIG. 3(B) is a top view corresponding to FIG. 3(A).

Figure 4A:
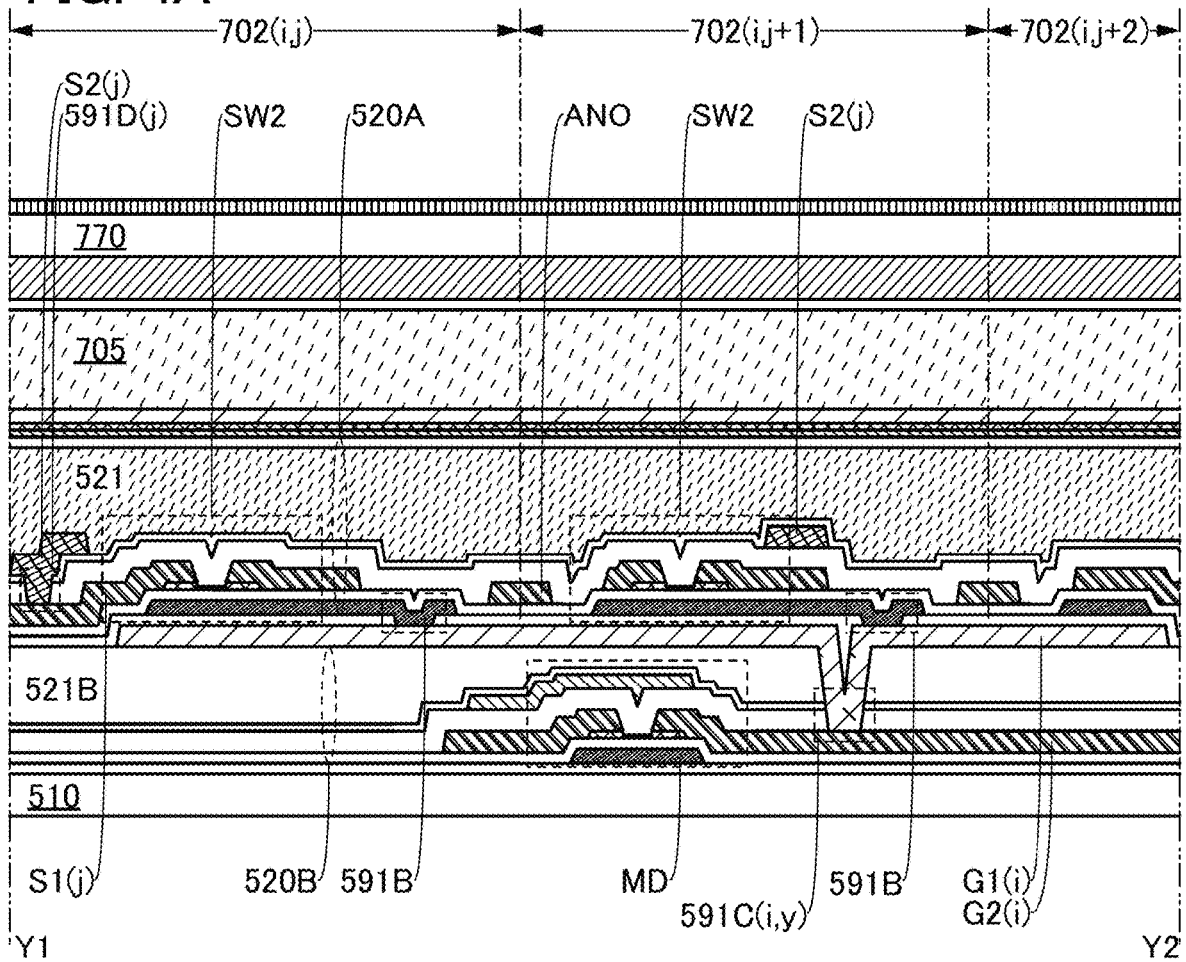
FIGS. 4A and 4B are cross-sectional views showing a structure of a display panel of an embodiment.
Figure 4B:
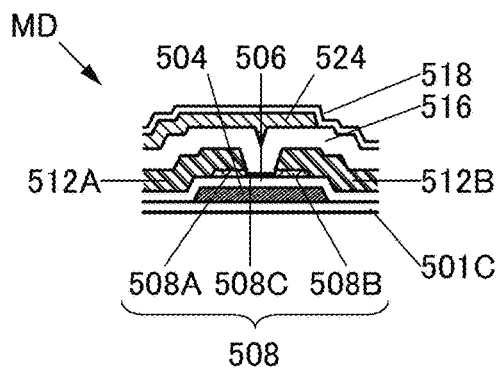

FIG. 4 shows a structure of the display panel of one embodiment of the present invention. FIG. 4(A) is a cross-sectional view taken along a cutting plane line Y1-Y2 in FIG. 3(B), and FIG. 4(B) is a cross-sectional view showing part of FIG. 4(A).

Figure 5:
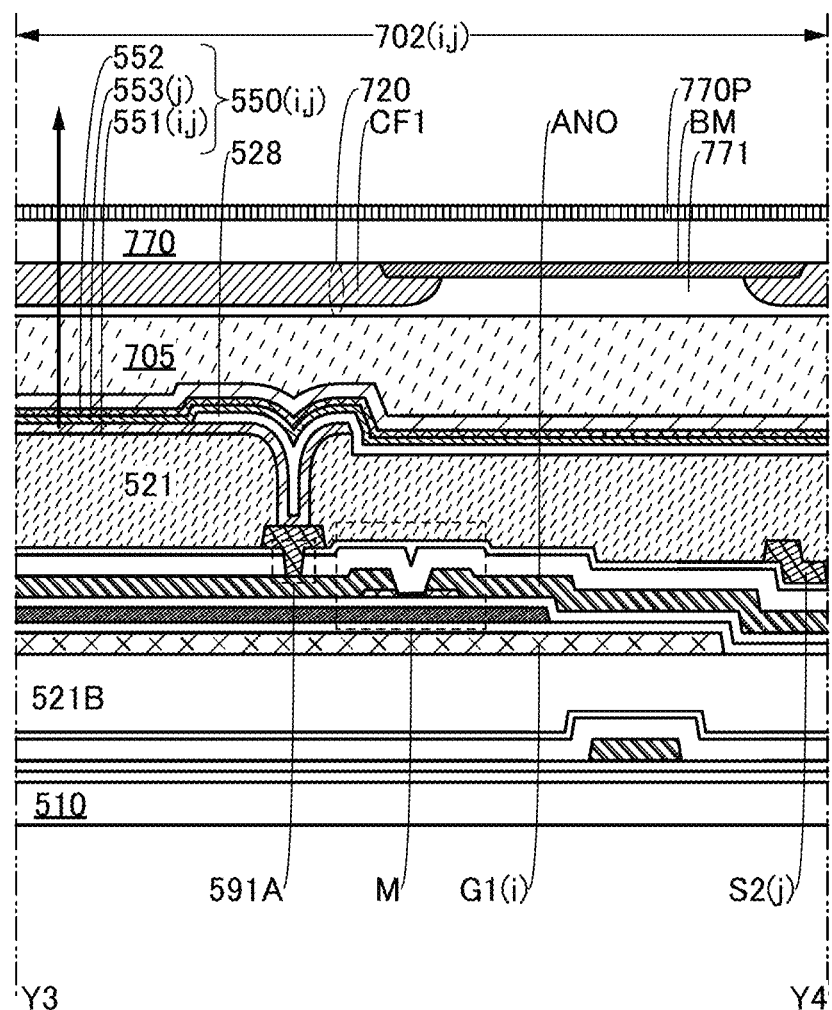
FIG. 5 is a cross-sectional view showing a structure of a display panel of an embodiment.

FIG. 5 shows a structure of the display panel of one embodiment of the present invention. FIG. 5 is a cross-sectional view taken along a cutting plane line Y3-Y4 in FIG. 3(B).

Figure 6A:
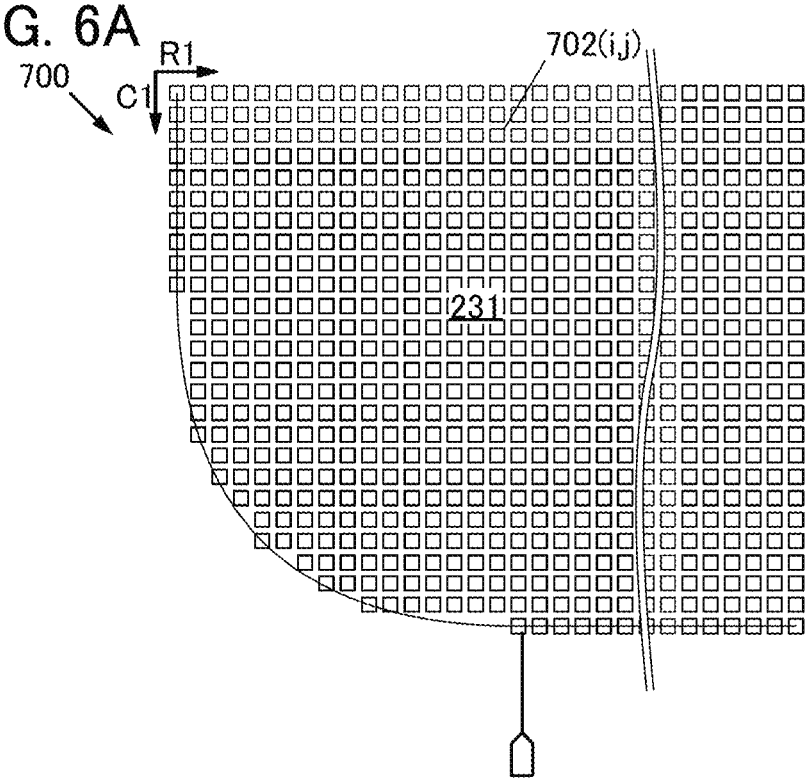
FIGS. 6A and 6B are views showing a structure of a display panel of an embodiment.
Figure 6B:
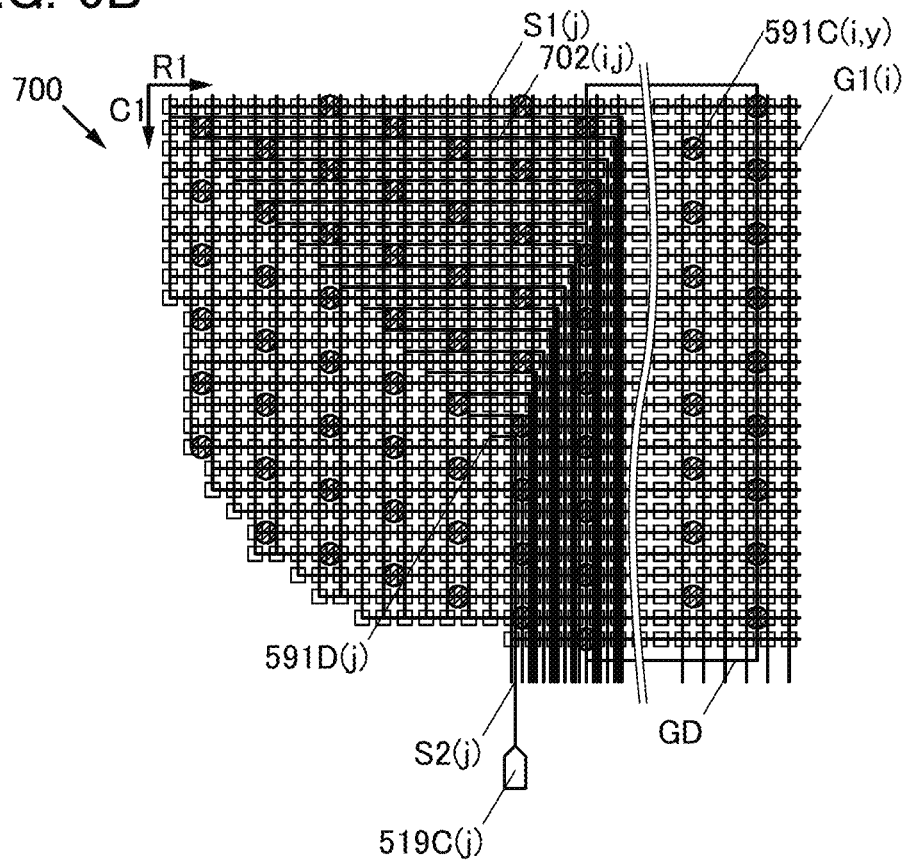

FIG. 6 is a view illustrating a structure of the display panel of one embodiment of the present invention. FIG. 6(A) is a top view showing part of the display panel of one embodiment of the present invention, and FIG. 6(B) is a schematic view showing the details of FIG. 6(A).

Figure 7A:
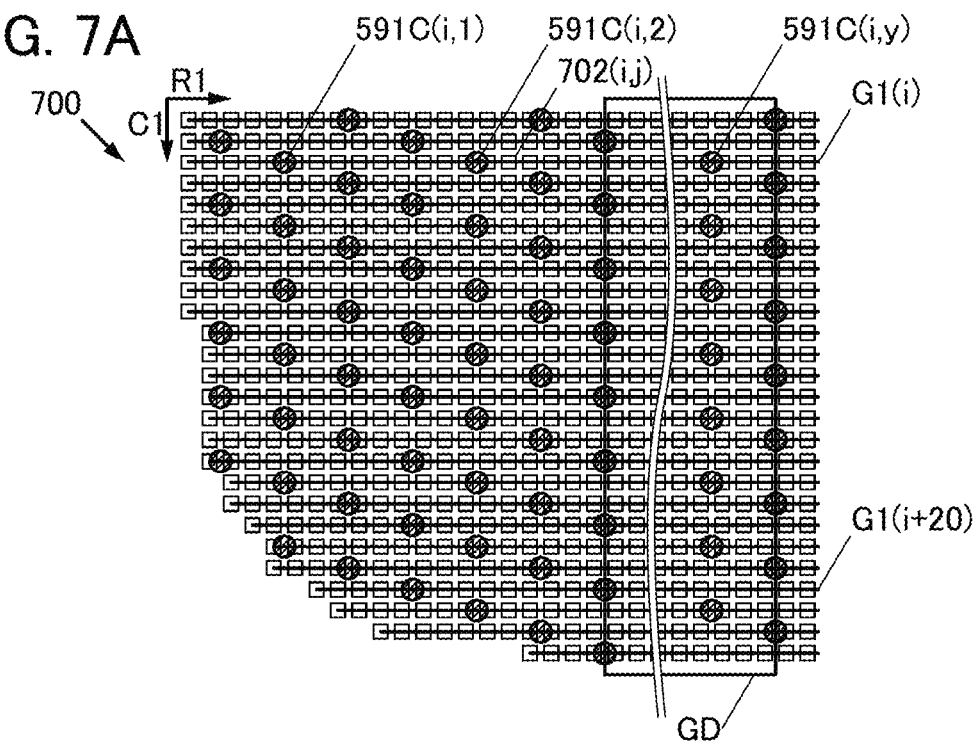
FIGS. 7A and 7B are views showing a structure of a display panel of an embodiment.
Figure 7B:
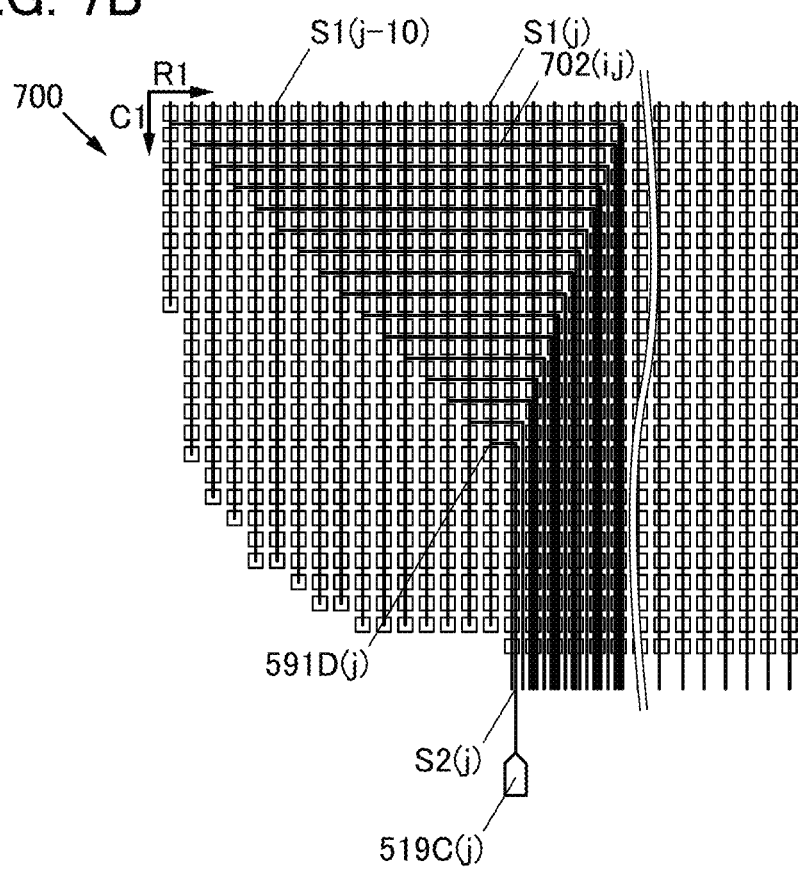

FIG. 7(A) is a top view showing part of FIG. 6(B), and FIG. 7(B) is a top view showing another part of FIG. 6(B).

Figure 8:
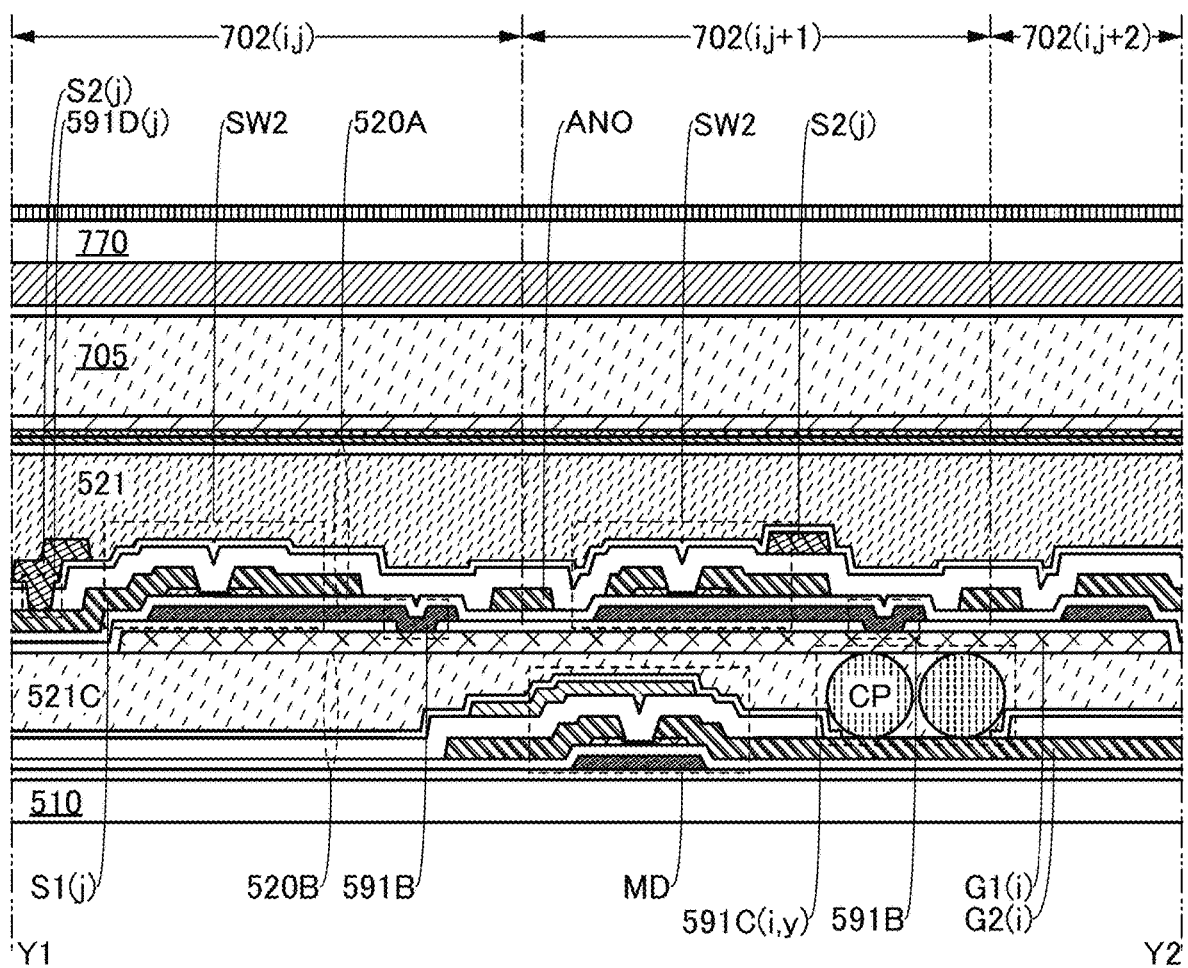
FIG. 8 is a cross-sectional view showing a structure of a display panel of an embodiment.

FIG. 8 shows a structure of a modification example of the display panel of one embodiment of the present invention. FIG. 8 is a cross-sectional view taken along the cutting plane line Y1-Y2 in FIG. 3(B).

Figure 9:
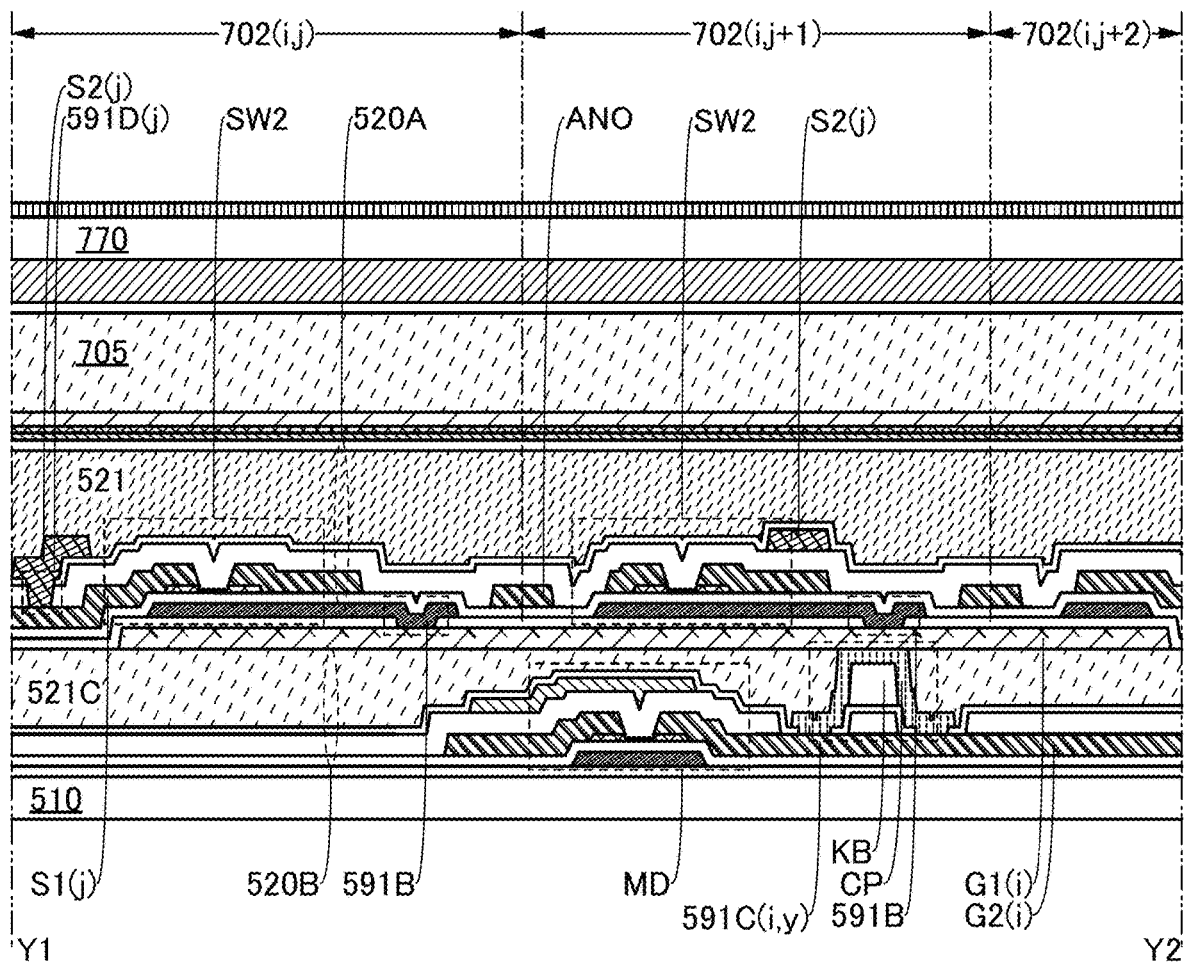
FIG. 9 is a cross-sectional view showing a structure of a display panel of an embodiment.

FIG. 9 shows a structure of a modification example of the display panel of one embodiment of the present invention. FIG. 9 is a cross-sectional view taken along the cutting plane line Y3-Y4 in FIG. 3(B).

Figure 10:
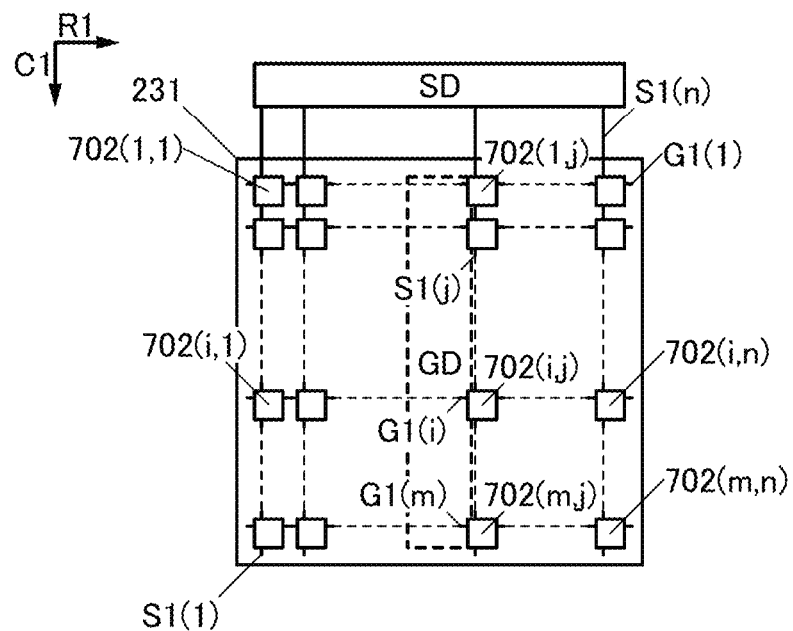
FIGS. 10 and 10B are views showing a structure of a display panel of an embodiment.
Figure 10B:
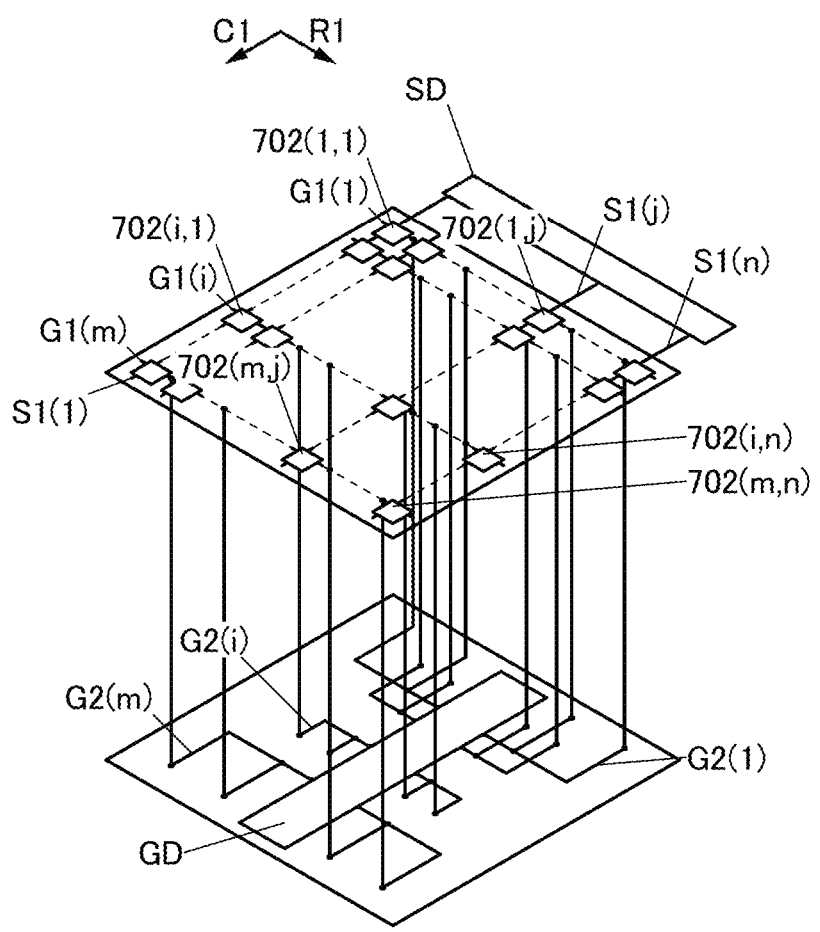

FIG. 10 shows a structure of the display panel of one embodiment of the present invention. FIG. 10(A) is a top view showing the arrangement of a display region and a driver circuit, and FIG. 10(B) is a perspective view of FIG. 10(A).

Note that in this specification, an integer variable of 1 or more is sometimes used in reference numerals. For example, (p) where p is an integer variable of 1 or more is sometimes used in part of a reference numeral that specifies any of p components at a maximum. For another example, (m, n) where m and n are each an integer variable of 1 or more is sometimes used in part of a reference numeral that specifies any of m×n components at a maximum.

Structure Example 1 of Display Panel

The display panel 700 described in this embodiment includes the display region 231, the functional layer 520A, the functional layer 520B, and the first connection portion 591C(i, y) (see FIG. 1(A) and FIG. 1(B)).

Structure Example 1 of Display Region 231

The display region 231 includes the pixel 702(i, j).

Structure Example 1 of Pixel 702(i, j)

The pixel 702(i, j) includes the display element 550(i, j) and the pixel circuit 530(i, j) (see FIG. 1(B) and FIG. 2(B)).

Structure Example 1 of Functional Layer 520A

The functional layer 520A includes the pixel circuit 530(i, j) and the scan line G1(i) (see FIG. 2(B) and FIG. 4(A)).

Structure Example 1 of Display Element 550(i, j)

The display element 550(i, j) is electrically connected to the pixel circuit 530(i, j) (see FIG. 1(B), FIG. 2(B), and FIG. 5).

The display element 550(i, j) has a function of emitting light. The display element 550(i, j) includes a layer 553(j) containing a light-emitting material (see FIG. 5).

A display element having a function of emitting light, for example, can be used as the display element 550(i, j). Specifically, an organic electroluminescence element, an inorganic electroluminescence element, a light-emitting diode such as a microLED, a QDLED (Quantum Dot LED), or the like can be used as the display element 550(i, j).

Structure Example 1 of Layer 553(j) Containing Light-Emitting Material

A belt-like layered material that is long in the column direction along the signal line S1(j) can be used for the layer 553(j) containing a light-emitting material, for example.

Specifically, materials emitting light with different hues can be used for the layer 553(j) containing a light-emitting material, a layer 553(j+1) containing a light-emitting material, and a layer 553(j+2) containing a light-emitting material. Thus, for example, the hue of light emitted by the display element 550(i, j) can be different between columns.

For example, a material that emits blue light, a material that emits green light, and a material that emits red light can be used as the materials emitting light with different hues.

Structure Example 2 of Layer 553(j) Containing Light-Emitting Material

A layered material for emitting white light can be used for the layer 553(j) containing a light-emitting material, for example.

Specifically, materials that emit light with different hues can be used for the layer 553(j) containing a light-emitting material.

For example, a layered material in which a layer containing a light-emitting material including a fluorescent material that emits blue light and a layer containing materials that are other than fluorescent materials and that emit green light and red light are stacked can be used for the layer 553(j) containing a light-emitting material. Alternatively, a layered material in which a layer containing a light-emitting material including a fluorescent material that emits blue light and a layer containing a material that is other than fluorescent materials and that emits yellow light are stacked can be used for the layer 553(j) containing a light-emitting material.

A light-emitting unit can be used for the layer 553(j) containing a light-emitting material, for example. The light-emitting unit includes one region where electrons injected from one side are recombined with holes injected from the other side. The light-emitting unit contains a light-emitting material, and the light-emitting material releases energy generated by recombination of electrons and holes as light.

A plurality of light-emitting units and an intermediate layer can be used for the layer 553(j) containing a light-emitting material, for example. The intermediate layer includes a region positioned between two light-emitting units. The intermediate layer includes a charge-generation region and has functions of supplying holes to the light-emitting unit provided on the cathode side and supplying electrons to the light-emitting unit provided on the anode side. Furthermore, a structure including a plurality of light-emitting units and an intermediate layer is referred to as a tandem light-emitting element in some cases.

For example, a light-emitting unit including a material emitting light with one hue and a light-emitting unit including a material emitting light with a different hue can be used for the layer 553(j) containing a light-emitting material.

For example, a high molecular compound (e.g., an oligomer, a dendrimer, or a polymer), a middle molecular compound (a compound between a low molecular compound and a high molecular compound with a molecular weight greater than or equal to 400 and less than or equal to 4000), or the like can be used for the layer 553(j) containing a light-emitting material.

<<Electrode 551(i, j) and Electrode 552>>

An electrode 551(i, j) is electrically connected to the pixel circuit 530(i, j) in a connection portion 591A (see FIG. 5).

For example, the material that can be used for the wiring or the like can be used for the electrode 551(i, j) or an electrode 552. Specifically, a material that has a visible-light-transmitting property can be used for the electrode 551(i, j) or the electrode 552.

For example, a conductive oxide, a conductive oxide containing indium, indium oxide, indium tin oxide, indium zinc oxide, zinc oxide, zinc oxide to which gallium is added, or the like can be used. Alternatively, a metal film thin enough to transmit light can be used. Alternatively, a material that has a visible-light-transmitting property can be used.

For example, a metal film that transmits part of light and reflects another part of the light can be used for the electrode 551(i, j) or the electrode 552. Thus, for example, the distance between the electrode 551(i, j) and the electrode 552 can be adjusted. Alternatively, a microcavity structure can be provided in the display element 550(i, j). Alternatively, light of a predetermined wavelength can be extracted more efficiently than other light. Alternatively, light with a narrow half width of a spectrum can be extracted. Alternatively, light of a bright color can be extracted.

For example, a film that reflects light efficiently can be used for the electrode 551(i, j) or the electrode 552. Specifically, a material containing silver, palladium, and the like or a material containing silver, copper, and the like can be used for the metal film.

Structure Example 1 of Pixel Circuit 530(i, j)

The pixel circuit 530(i, j) is electrically connected to the scan line G1(i) (see FIG. 2(B) and FIG. 4(A)).

A switch, a transistor, a diode, a resistor, an inductor, a capacitor, or the like can be used in the pixel circuit 530(i, j), for example.

The pixel circuit 530(i, j) includes the switch SW2, the transistor M, and the capacitor C21. For example, a transistor can be used as the switch SW2.

Structure Example 1 of Switch SW2

The transistor used as the switch SW2 includes a semiconductor.

The transistor includes a semiconductor film 508, a conductive film 504, a conductive film 512A, and a conductive film 512B (see FIG. 4(B)).

The semiconductor film 508 includes a region 508A electrically connected to the conductive film 512A and a region 508B electrically connected to the conductive film 512B. The semiconductor film 508 includes a region 508C between the region 508A and the region 508B.

The conductive film 504 includes a region overlapping with the region 508C, and the conductive film 504 has a function of a gate electrode.

An insulating film 506 includes a region positioned between the semiconductor film 508 and the conductive film 504. The insulating film 506 has a function of a gate insulating film.

The conductive film 512A has one of a function of a source electrode and a function of a drain electrode, and the conductive film 512B has the other of the function of the source electrode and the function of the drain electrode. Note that the conductive film 512A or the conductive film 512B can be used as the wiring G2(i).

Structure Example 1 of Transistor M

For example, semiconductor films that can be formed in the same step can be used for the transistor used as the switch SW2 and the transistor M. The same structure can be employed for the transistor used as the switch SW2 and the transistor M.

A conductive film 524 can be used for the transistor. The semiconductor film 508 is positioned between the conductive film 504 and a region included in the conductive film 524. The conductive film 524 has a function of a second gate electrode. The conductive film 524 can be electrically connected to the conductive film 504, for example.

Note that semiconductor films that can be formed in the same step can be used for transistors in the driver circuit and the pixel circuit, for example.

A bottom-gate transistor or a top-gate transistor can be used in the pixel circuit 530(i, j), for example. Alternatively, these transistors can be used as the transistors in the driver circuit.

Structure Example 1 of Semiconductor Film 508

A semiconductor containing a Group 14 element can be used for the semiconductor film 508, for example. Specifically, a semiconductor containing silicon can be used for the semiconductor film 508.

[Hydrogenated Amorphous Silicon]

For example, hydrogenated amorphous silicon can be used for the semiconductor film 508. Alternatively, microcrystalline silicon or the like can be used for the semiconductor film 508. Thus, a display panel having less display unevenness than a display panel that uses polysilicon for the semiconductor film 508, for example, can be provided. Alternatively, the size of the display panel can be easily increased.

[Polysilicon]

For example, polysilicon can be used for the semiconductor film 508. In this case, for example, the field-effect mobility of the transistor can be higher than that of a transistor that uses hydrogenated amorphous silicon for the semiconductor film 508. Alternatively, for example, the driving capability can be higher than that of a transistor that uses hydrogenated amorphous silicon for the semiconductor film 508. Alternatively, for example, the aperture ratio of the pixel can be higher than that in the case of using a transistor that uses hydrogenated amorphous silicon for the semiconductor film 508.

Alternatively, for example, the reliability of the transistor can be higher than that of a transistor that uses hydrogenated amorphous silicon for the semiconductor film 508.

Alternatively, the temperature required for manufacture of the transistor can be lower than that required for a transistor that uses single crystal silicon, for example.

Alternatively, the semiconductor film used for the transistor in the driver circuit can be formed in the same process as the semiconductor film used for the transistor in the pixel circuit. Alternatively, the driver circuit can be formed over the same substrate over which the pixel circuit is formed. Alternatively, the number of components included in an electronic device can be reduced.

[Single Crystal Silicon]

For example, single crystal silicon can be used for the semiconductor film. In this case, for example, the resolution can be higher than that of a display panel that uses hydrogenated amorphous silicon for the semiconductor film 508. Alternatively, for example, a display panel having less display unevenness than a display panel that uses polysilicon for the semiconductor film 508 can be provided. Alternatively, for example, smart glasses or a head mounted display can be provided.

Structure Example 2 of Semiconductor Film 508

For example, a metal oxide can be used for the semiconductor film 508. Thus, a pixel circuit can hold an image signal for a longer time than a pixel circuit utilizing a transistor that uses amorphous silicon for a semiconductor film. Specifically, a selection signal can be supplied at a frequency of lower than 30 Hz, preferably lower than 1 Hz, further preferably less than once per minute with the suppressed occurrence of flickers. Consequently, fatigue accumulation in a user of a data processing device can be reduced. Moreover, power consumption for driving can be reduced.

A transistor using an oxide semiconductor can be used, for example. Specifically, an oxide semiconductor containing indium or an oxide semiconductor containing indium, gallium, and zinc can be used for the semiconductor film.

A transistor having a lower leakage current in an off state than a transistor that uses amorphous silicon for a semiconductor film can be used, for example. Specifically, a transistor that uses an oxide semiconductor for a semiconductor film can be used.

A 25-nm-thick film containing indium, gallium, and zinc can be used as the semiconductor film 508, for example.

A conductive film in which a 10-nm-thick film containing tantalum and nitrogen and a 300-nm-thick film containing copper are stacked can be used as the conductive film 504, for example. Note that the film containing copper includes a region; between the region and the insulating film 506, the film containing tantalum and nitrogen is positioned.

A stacked-layer film in which a 400-nm-thick film containing silicon and nitrogen and a 200-nm-thick film containing silicon, oxygen, and nitrogen are stacked can be used for the insulating film 506, for example. Note that the film containing silicon and nitrogen includes a region; between the region and the semiconductor film 508, the film containing silicon, oxygen, and nitrogen is positioned.

A conductive film in which a 50-nm-thick film containing tungsten, a 400-nm-thick film containing aluminum, and a 100-nm-thick film containing titanium are stacked in this order can be used as the conductive film 512A or the conductive film 512B, for example. Note that the film containing tungsten includes a region in contact with the semiconductor film 508.

A manufacturing line for a bottom-gate transistor that uses amorphous silicon as a semiconductor can be easily remodeled into a manufacturing line for a bottom-gate transistor that uses an oxide semiconductor as a semiconductor, for example. Furthermore, for example, a manufacturing line for a top-gate transistor that uses polysilicon as a semiconductor can be easily remodeled into a manufacturing line for a top-gate transistor that uses an oxide semiconductor as a semiconductor. In either remodeling, an existing manufacturing line can be effectively utilized.

This can suppress flickering. Alternatively, the power consumption can be reduced. Alternatively, a moving image with quick movements can be smoothly displayed. Alternatively, a photograph and the like can be displayed with a wide range of grayscale. As a result, a novel display panel that is highly convenient or reliable can be provided.

Structure Example 3 of Semiconductor Film 508

For example, a compound semiconductor can be used as the semiconductor of the transistor. Specifically, a semiconductor containing gallium arsenide can be used.

For example, an organic semiconductor can be used as the semiconductor of the transistor. Specifically, an organic semiconductor containing polyacene or graphene can be used for a semiconductor film.

Structure Example 1 of Functional Layer 520B

The functional layer 520B includes the region overlapping with the functional layer 520A (see FIG. 1(B)). The functional layer 520B includes the driver circuit GD and the wiring G2($i$) (see FIG. 4(A)). For example, an insulating film 521B can be used for the functional layer 520B. For example, a material that can be used for an insulating film 521 described later can be used for the insulating film 521B.

Structure Example 1 of Driver Circuit GD

The driver circuit GD is provided so that the pixel circuit 530($i$, $j$) is positioned between the driver circuit GD and the display element 550($i$, $j$) (see FIG. 1(B)).

The driver circuit GD supplies a selection signal. For example, the driver circuit GD can supply a selection signal to the wiring G2($i$), thereby supplying the selection signal to the scan line G1($i$) through the connection portion 591C(i, y).

For example, a transistor MD can be used in the driver circuit GD (see FIG. 4(B)). The structure that can be used for the transistor M can be used for the transistor MD.

Structure Example 1 of Scan Line G1($i$)

The scan line G1($i$) includes a region positioned between the driver circuit GD and a group of pixel circuits 530($i$, 1) to 530($i$, $n$) (see FIG. 3(A) and FIG. 4(A)). Accordingly, the scan line G1($i$) can block noise generated by the driver circuit GD, for example. Alternatively, the scan line G1($i$) can block noise generated by the pixel circuit 530($i$, $j$). Alternatively, a malfunction of the pixel circuit 530($i$, $j$) due to noise can be prevented. Alternatively, a malfunction of the driver circuit GD due to noise can be prevented. Alternatively, a degradation in image quality caused by noise can be prevented.

Structure Example 1 of Wiring G2(i)

The wiring G2(i) is electrically connected to the scan line G1(i) at the connection portion 591C(i, y). The wiring G2(i) is electrically connected to the driver circuit GD. For example, an opening portion formed in the insulating film 521B, an insulating film 518, and an insulating film 516 can be used for the connection portion 591C(i, y) (see FIG. 4(A) and FIG. 4(B)).

Thus, the flexibility in the layout of the driver circuit GD can be increased. For example, the driver circuit GD can be provided so as to overlap with the display region 231. Alternatively, an outward form of the driver circuit GD does not have to be formed along an outward form of the display panel 700. Alternatively, the freedom of the outward form of the display panel 700 can be increased. For example, a curved line can be contained in the contours of the display region 231. Alternatively, the outward form of the display panel 700 can be made small. Alternatively, a peripheral portion of the display panel can be cut and the outward form of the display panel can be shaped into a predetermined shape. As a result, a novel display panel that is highly convenient or reliable can be provided.

Structure Example 2 of Wiring G2(i)

For example, a conductive film having a lower electric resistance than the scan line G1(i) can be used as the wiring G2(i). Alternatively, a conductive film which has a narrower width than the scan line G1(i) can be used as the wiring G2(i).

Thus, electric resistance between the driver circuit GD and the pixel circuit 530(i, j) can be reduced. Alternatively, the degree of waveform distortion of the control signal SP can be reduced. Alternatively, the degree of feedthrough can be reduced. As a result, a novel display panel that is highly convenient or reliable can be provided.

Structure Example 2 of Display Panel

The display panel 700 described in this embodiment includes the terminal 519C(j) (see FIG. 1(B) and FIG. 7(B)).

Structure Example 2 of Functional Layer 520A

The functional layer 520A includes the signal line S1(j), the auxiliary signal line S2(j), and the connection portion 591D(j) (see FIG. 4(A)).

Structure Example 1 of Signal Line S1(j)

The signal line S1(j) is electrically connected to the pixel circuit 530(i, j). The signal line S1(j) is electrically connected to the auxiliary signal line S2(j) at the connection portion 591D(j) (see FIG. 4(B)).

Structure Example 1 of Auxiliary Signal Line S2(j)

The auxiliary signal line S2(j) includes the region intersecting another signal line S1(j+1), and the auxiliary signal line S2(j) is electrically connected to the terminal 519C(j) (see FIG. 3(B) and FIG. 7(B)). For example, the auxiliary signal line S2(j) intersects the signal line S1(j+1).

Furthermore, the signal line S1(j) is electrically connected to the auxiliary signal line S2(j) at the connection portion 591D(j) provided at not an end portion but a point other than the end portion of the signal line S1(j), which enables the electric resistance between the pixel circuit 530(i, j) selected from a different group of pixel circuits 530(1, j) to 530(m, j) and the terminal 519C(j) to average out.

Thus, the flexibility in the layout of the terminal 519C(j) can be increased. Alternatively, the freedom of the outward form of the display panel 700 can be increased. Alternatively, the outward form of the display panel 700 can be made small. Alternatively, the degree of waveform distortion of the data V11 supplied from the terminal 519C(j) can average out in the pixel circuit 530(i, j). As a result, a novel display panel that is highly convenient or reliable can be provided.

Structure Example 3 of Display Panel

In the display panel 700 described in this embodiment, the display region 231 includes the scan line G1(i) and the scan line G1(p) (see FIG. 2(A)). The scan line G1(p) is electrically connected to pixels fewer than pixels to which the scan line G1(i) is electrically connected to.

For example, a scan line G1(i+20) is electrically connected to pixels fewer than pixels to which the scan line G1(i) is electrically connected to (see FIG. 7(A)). Specifically, the number of pixels that are electrically connected to the scan line G1(i+20) is smaller than that of pixels that are electrically connected to the scan line G1(i) by six.

Structure Example 4 of Display Panel

In the display panel 700 described in this embodiment, the display region 231 includes the signal line S1(j) and the signal line S1(q) (see FIG. 2(A)). The signal line S1(q) is electrically connected to pixels fewer than pixels to which the signal line S1(j) is electrically connected to.

For example, a signal line S1(i−10) is electrically connected to pixels fewer than pixels to which a signal line S1(i) is electrically connected to (see FIG. 7(B)). Specifically, the number of pixels that are electrically connected to the signal line S1(i−10) is smaller than that of pixels that are electrically connected to the signal line S1(i) by three.

Thus, the freedom of the outward form of the display panel 700 can be increased. For example, a curved line can be contained in the contours of the display region 231. Alternatively, the outward form of the display panel can be formed along the display region having a curved line. Alternatively, for example, pixels can be arranged along a curved line. As a result, a novel display panel that is highly convenient or reliable can be provided.

Structure Example 5 of Display Panel

In the display panel 700 described in this embodiment, the display region 231 includes the group of pixels 702(i, 1) to 702(i, n) and the different group of pixels 702(1, j) to 702(m, j) (see FIG. 10(A) and FIG. 10(B)).

Although not shown, the display region 231 includes a conductive film VCOM2 and a conductive film ANO.

Structure Example 1 of Group of Pixels

The group of pixels 702(i, 1) to 702(i, n) include the pixel 702(i, j), and the group of pixels 702(i, 1) to 702(i, n) are provided in the row direction (the direction indicated by an arrow R1 in the drawing). Furthermore, the group of pixels 702(i, 1) to 702(i, n) are electrically connected to the scan line G1(i).

The different group of pixels 702(1, j) to 702(m, j) include the pixel 702(i, j), and the different group of pixels 702(1, j) to 702(m, j) are provided in the column direction (the direction indicated by an arrow C1 in the drawing) that intersects the row direction. The different group of pixels 702(1, j) to 702(m, j) are electrically connected to the signal line S1(j).

Thus, image data can be supplied to a plurality of pixels. As a result, a novel display panel that is highly convenient or reliable can be provided.

Structure Example 6 of Display Panel

The display panel 700 described in this embodiment includes the group of connection portions 591C(i, 1) to the group of connection portions 591C(i, h) (see FIG. 7(A)). Note that h is a natural number greater than or equal to 1, preferably greater than 1 and smaller than n. For example, if the number of connection portions is more than one, the probability of occurrence of connection defects can be reduced. If the number of connection portions is less than n, the probability of short circuit of connection portions in adjacent rows can be reduced; specifically, the connection portion 591C(i, y) is not easily short-circuited to a connection portion 591C(i−1, y) or a connection portion 591C(i+1, y).

Furthermore, the scan line G1(i) is electrically connected to the wiring G2(i) at the connection portion 591C(i, y) provided at not an end portion but a point other than the end portion of the scan line G1(i), which enables the electric resistance between the pixel circuit 530(i, j) selected from the group of pixel circuits 530(i, 1) to 530(i, n) and the driver circuit GD to average out.

Furthermore, the scan line G1(i) is electrically connected to the wiring G2(i) at the group of connection portions 591C(i, 1) to the group of connection portions 591C(i, h), which enables the electric resistance between the pixel circuit 530(i, j) selected from the group of pixel circuits 530(i, 1) to 530(i, n) and the driver circuit GD to average out.

Accordingly, the degree of waveform distortion of the control signal SP can average out. Alternatively, the degree of feedthrough can average out. Alternatively, display unevenness can be reduced. As a result, a novel display panel that is highly convenient or reliable can be provided.

Structure Example 1 of Group of Connection Portions 591C(i, 1) to the Group of Connection Portions 591C(i, h)

The group of connection portions 591C(i, 1) to the group of connection portions 591C(i, h) include the connection portion 591C(i, y), and the scan line G1(i) is electrically connected to the wiring G2(i) in the group of connection portions 591C(i, 1) to the group of connection portions 591C(i, h) (see FIG. 7(A)).

Thus, the scan line G1(i) can be electrically connected to the wiring G2(i). Alternatively, the probability of occurrence of connection defects can be reduced. As a result, a novel display panel that is highly convenient or reliable can be provided.

Structure Example 2 of Connection Portion 591C(i, y)

In the display panel 700 described in this embodiment, the connection portion 591C(i, y) includes the conductive member CP (see FIG. 8 and FIG. 9).

Structure Example 1 of Conductive Member CP

The conductive member CP has a function of electrically connecting the scan line G1(i) and the wiring G2(i).

For example, a conductive particle can be used as the conductive member CP.

For example, a particle having a spherical shape, a columnar shape, a fiber shape, or the like with a size of greater than or equal to 1 μm and smaller than or equal to 200 μm, preferably greater than or equal to 3 μm and smaller than or equal to 150 μm can be used as the particle CP. Alternatively, a particle covered with a conductive material containing nickel, gold, or the like can be used, for example. Specifically, a particle containing polystyrene, an acrylic resin, titanium oxide, or the like can be used. Specifically, the conductive member CP dispersed in an insulating material 521C can be used. For example, synthetic rubber, a thermosetting resin, a thermoplastic resin, an adhesive, or the like can be used as the insulating material 521C.

For example, a projecting structure body KB can be used for the connection portion 591C(i, y). Alternatively, the conductive member CP formed over the structure body KB can be used.

Thus, the scan line G1(i) can be electrically connected to the wiring G2(i). Alternatively, the probability of occurrence of connection defects can be reduced. As a result, a novel display panel that is highly convenient or reliable can be provided.

Structure Example 6 of Display Panel

The display panel 700 includes the base 510, the base 770, and an insulating film 501C (see FIG. 4(A)).

The insulating film 501C includes a region positioned between the base 770 and the base 510, and the insulating film 501C includes a region positioned between the functional layer 520A and the base 510.

Structure Example 3 of Functional Layer 520A

The functional layer 520A includes an insulating film 521, an insulating film 518, the insulating film 516, the insulating film 506, the insulating film 501C, and the like.

[Insulating Film 521]

The insulating film 521 includes a region positioned between the pixel circuit 530(i, j) and the display element 550(i, j) (see FIG. 5).

An insulating inorganic material, an insulating organic material, or an insulating composite material containing an inorganic material and an organic material, for example, can be used for the insulating film 521.

Specifically, an inorganic oxide film, an inorganic nitride film, an inorganic oxynitride film, or the like, or a layered material in which a plurality of films selected from these films are stacked can be used as the insulating film 521.

For example, a film including a silicon oxide film, a silicon nitride film, a silicon oxynitride film, an aluminum oxide film, or the like, or a film including a layered material in which a plurality of films selected from these films are stacked can be used as the insulating film 521. Note that the silicon nitride film is a dense film and has an excellent function of inhibiting diffusion of impurities.

For example, for the insulating film 521, polyester, polyolefin, polyamide, polyimide, polycarbonate, polysiloxane, an acrylic resin, or the like, or a layered material, a composite material, or the like of a plurality of resins selected from these resins can be used. Alternatively, a photosensitive material may be used. Thus, the insulating film 521 can planarize a level difference due to various components overlapping with the insulating film 521, for example.

Note that polyimide is excellent in thermal stability, insulating property, toughness, low dielectric constant, low coefficient of thermal expansion, chemical resistance, and other properties compared with other organic materials. Accordingly, in particular, polyimide can be suitably used for the insulating film 521 or the like.

For example, a film formed using a photosensitive material can be used as the insulating film 521. Specifically, a film formed using photosensitive polyimide, a photosensitive acrylic resin, or the like can be used as the insulating film 521.

For example, a light-transmitting material can be used for the insulating film 521. Specifically, silicon nitride can be used for the insulating film 521.

[Insulating Film 518]

The insulating film 518 includes a region positioned between the pixel circuit 530(*i, j*) and the insulating film 521 (see FIG. 4(B)). Note that a stacked-layer film can be used as the insulating film 518.

The material that can be used for the insulating film 521, for example, can be used for the insulating film 518.

For example, a material that has a function of inhibiting diffusion of oxygen, hydrogen, water, an alkali metal, an alkaline earth metal, and the like can be used for the insulating film 518. Specifically, a nitride insulating film can be used as the insulating film 518. For example, silicon nitride, silicon nitride oxide, aluminum nitride, aluminum nitride oxide, or the like can be used for the insulating film 518. Thus, diffusion of impurities to a semiconductor film of a transistor can be inhibited.

[Insulating Film 516]

The insulating film 516 includes a region positioned between the pixel circuit 530(*i, j*) and the insulating film 518 (see FIG. 4(B)). Note that a stacked-layer film can be used as the insulating film 516.

The material that can be used for the insulating film 521, for example, can be used for the insulating film 516. Specifically, a film formed by a manufacturing method different from that of the insulating film 518 can be used as the insulating film 516.

[Insulating Film 506]

The insulating film 506 includes a region positioned between the semiconductor film 508 and a conductive film 504 (see FIG. 4(B)).

The material that can be used for the insulating film 521, for example, can be used for the insulating film 506. Specifically, a film including a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film can be used as the insulating film 506.

[Insulating Film 501C]

The insulating film 501C includes a region positioned between the pixel circuit 530(*i, j*) and the base 510 (see FIG. 4(A)).

The material that can be used for the insulating film 521, for example, can be used for the insulating film 501C. Specifically, a material containing silicon and oxygen can be used for the insulating film 501C. Thus, diffusion of impurities into the pixel circuit, the display element, or the like can be inhibited.

[Insulating Film 528]

An insulating film 528 includes a region positioned between the insulating film 521 and the base 770 and has an opening portion in a region overlapping with the display element 550(*i, j*) (see FIG. 5). The insulating film 528 formed along the periphery of the electrode 551(*i, j*) prevents a short circuit between the electrode 551(*i, j*) and the electrode 552.

The material that can be used for the insulating film 521, for example, can be used for the insulating film 528. Specifically, a silicon oxide film, a film containing an acrylic resin, or a film containing polyimide can be used as the insulating film 528.

<<Sealant 705>>

The sealant 705 includes a region positioned between the functional layer 520A and the base 770 and has a function of bonding the functional layer 520A and the base 770 together.

An inorganic material, an organic material, a composite material of an inorganic material and an organic material, or the like can be used for the sealant 705.

For example, an organic material such as a thermally fusible resin or a curable resin can be used for the sealant 705.

For example, an organic material such as a reactive curable adhesive, a photocurable adhesive, a thermosetting adhesive, and/or an anaerobic adhesive can be used for the sealant 705.

Specifically, an adhesive containing an epoxy resin, an acrylic resin, a silicone resin, a phenol resin, a polyimide resin, an imide resin, a PVC (polyvinyl chloride) resin, a PVB (polyvinyl butyral) resin, an EVA (ethylene vinyl acetate) resin, or the like can be used for the sealant 705.

<<Functional Layer 720>>

A functional layer 720 includes a coloring film CF, an insulating film 771, and a light-blocking film BM.

The coloring film CF includes a region positioned between the base 770 and the display element 550(*i, j*).

The light-blocking film BM has an opening portion in a region overlapping with the pixel 702(*i, j*).

<<Functional Film 770P and the Like>>

A functional film 770P includes a region overlapping with the display element 550(*i, j*).

An anti-reflection film, a polarizing film, a retardation film, a light diffusion film, a condensing film, or the like can be used as the functional film 770P, for example.

Specifically, a circularly polarizing film can be used as the functional film 770P.

Furthermore, an antistatic film suppressing the attachment of a dust, a water repellent film suppressing the attachment of a stain, an antireflective film (anti-reflection film), a non-glare film (anti-glare film), a hard coat film suppressing generation of a scratch in use, or the like can be used as the functional film 770P.

Note that this embodiment can be combined with other embodiments in this specification as appropriate.

Embodiment 2

Described in this embodiment is a metal oxide that can be used for a semiconductor film of a transistor disclosed in one embodiment of the present invention. Note that in the case where a metal oxide is used for a semiconductor film of a transistor, the metal oxide may be rephrased as an oxide semiconductor.

Oxide semiconductors are classified into a single crystal oxide semiconductor and a non-single-crystal oxide semiconductor. Examples of the non-single-crystal oxide semiconductor include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

An example of the non-single-crystal oxide semiconductor is an oxide semiconductor called a semi-crystalline oxide semiconductor. The semi-crystalline oxide semiconductor has an intermediate structure between the single crystal oxide semiconductor and the amorphous oxide semiconductor. The structure of the semi-crystalline oxide semiconductor is more stable than that of the amorphous oxide semiconductor. An example of the semi-crystalline oxide semiconductor is an oxide semiconductor having a CAAC structure and a CAC (Cloud-Aligned Composite) composition. The details of the CAC will be described below.

A CAC-OS (Cloud-Aligned Composite oxide semiconductor) may be used for a semiconductor film of a transistor disclosed in one embodiment of the present invention.

The aforementioned non-single-crystal oxide semiconductor or CAC-OS can be suitably used for a semiconductor film of a transistor disclosed in one embodiment of the present invention. As the non-single-crystal oxide semiconductor, the nc-OS or the CAAC-OS can be suitably used.

In one embodiment of the present invention, a CAC-OS is preferably used for a semiconductor film of a transistor. The use of the CAC-OS allows the transistor to have high electrical characteristics or high reliability.

The CAC-OS will be described in detail below.

A CAC-OS or a CAC-metal oxide has a conducting function in a part of the material and has an insulating function in a part of the material and has a function of a semiconductor as a whole. Note that in the case where the CAC-OS or the CAC-metal oxide is used in a channel formation region of a transistor, the conducting function is to allow electrons (or holes) serving as carriers to flow, and the insulating function is to not allow electrons serving as carriers to flow. By the complementary action of the conducting function and the insulating function, the CAC-OS or the CAC-metal oxide can have a switching function (On/Off function). In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. When carriers flow in this composition, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in the on state can achieve high current drive capability, that is, a high on-state current and high field-effect mobility.

In other words, the CAC-OS or the CAC-metal oxide can also be called a matrix composite or a metal matrix composite.

A CAC-OS refers to one composition of a material in which elements constituting a metal oxide are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in a metal oxide is hereinafter referred to as a mosaic pattern or a patch-like pattern.

Note that the metal oxide preferably contains at least indium. It is particularly preferable that the metal oxide contain indium and zinc. In addition to them, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For instance, a CAC-OS in an In—Ga—Zn oxide (an In—Ga—Zn oxide in the CAC-OS may be particularly referred to as CAC-IGZO) has a composition in which materials are separated into indium oxide (hereinafter, $InO_{X1}$ (X1 is a real number greater than 0)) or indium zinc oxide (hereinafter, $In_{X2}Zn_{Y2}O_{Z2}$ (X2, Y2, and Z2 are real numbers greater than 0)) and gallium oxide (hereinafter, $GaO_{X3}$ (X3 is a real number greater than 0)) or gallium zinc oxide (hereinafter, $Ga_{X4}Zn_{Y4}O_{Z4}$ (X4, Y4, and Z4 are real numbers greater than 0)), for example, so that a mosaic pattern is formed, and mosaic-like $InO_{X1}$ or $In_{X2}Zn_{Y2}O_{Z2}$ is evenly distributed in the film (which is hereinafter also referred to as cloud-like).

That is, the CAC-OS is a composite metal oxide having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ ($-1 \leq x0 \leq 1$; m0 is a given number).

The above crystalline compound has a single crystal structure, a polycrystalline structure, or a CAAC (c-axis aligned crystal) structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. The CAC-OS refers to a composition in which, in the material composition containing In, Ga, Zn, and O, some regions that include Ga as a main component and are observed as nanoparticles and some regions that include In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film including In as a main component and a film including Ga as a main component is not included.

Note that a clear boundary cannot sometimes be observed between the region including $GaO_{X3}$ as a main component and the region including $In_{X2}Zn_{Y2}O_{Z2}$ or $InO_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a film formation gas. Furthermore, the ratio of the flow rate of an oxygen gas to the total flow rate of the film formation gas at the time of film formation is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the analysis results of the X-ray diffraction that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region (ring region) and a plurality of bright spots in the ring region are observed. It is therefore found from the electron diffraction pattern that the crystal structure of the CAC-OS includes an nc (nano-crystal) structure with no alignment in the plan-view direction and the cross-sectional direction.

Moreover, for example, it can be checked by EDX mapping obtained using energy dispersive X-ray spectroscopy (EDX) that the CAC-OS in the In—Ga—Zn oxide has a composition in which regions including $GaOx_3$ as a main component and regions including $In_{X2}Zn_{Y2}O_{Z2}$ or $InO_{X1}$ as a main component are unevenly distributed and mixed.

The CAC-OS has a composition different from that of an IGZO compound in which the metal elements are evenly distributed, and has characteristics different from those of the IGZO compound. That is, the CAC-OS has a composition in which regions including $GaO_{X3}$ or the like as a main component and regions including $In_{X2}Zn_{Y2}O_{Z2}$ or $InO_{X1}$ as a main component are phase-separated from each other and form a mosaic pattern.

Here, a region including $In_{X2}Zn_{Y2}O_{Z2}$ or $InO_{X1}$ as a main component is a region whose conductivity is higher than that of a region including $GaO_{X3}$ or the like as a main component. In other words, when carriers flow through the regions including $In_{X2}Zn_{Y2}O_{Z2}$ or $InO_{X1}$ as a main component, the conductivity of an oxide semiconductor is exhibited. Accordingly, when the regions including $In_{X2}Zn_{Y2}O_{Z2}$ or $InO_{X1}$ as a main component are distributed in an oxide semiconductor like a cloud, high field-effect mobility (μ) can be achieved.

By contrast, a region including $GaO_{X3}$ or the like as a main component is a region whose insulating property is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and high field-effect mobility (μ) can be achieved.

Moreover, a semiconductor element using the CAC-OS has high reliability. Thus, the CAC-OS is most suitable for a variety of semiconductor devices such as display panels.

This embodiment can be combined with other embodiments as appropriate.

Embodiment 3

In this embodiment, a structure of a display device of one embodiment of the present invention will be described with reference to FIG. 11.

FIG. 11 is a view showing the structure of the display device of one embodiment of the present invention. FIG. 11(A) is a block diagram of the display device of one embodiment of the present invention. FIG. 11(B-1) to FIG. 11(B-3) are projection views explaining the appearance of the display device of one embodiment of the present invention.

Structure Example of Display Device

Figure 11A:
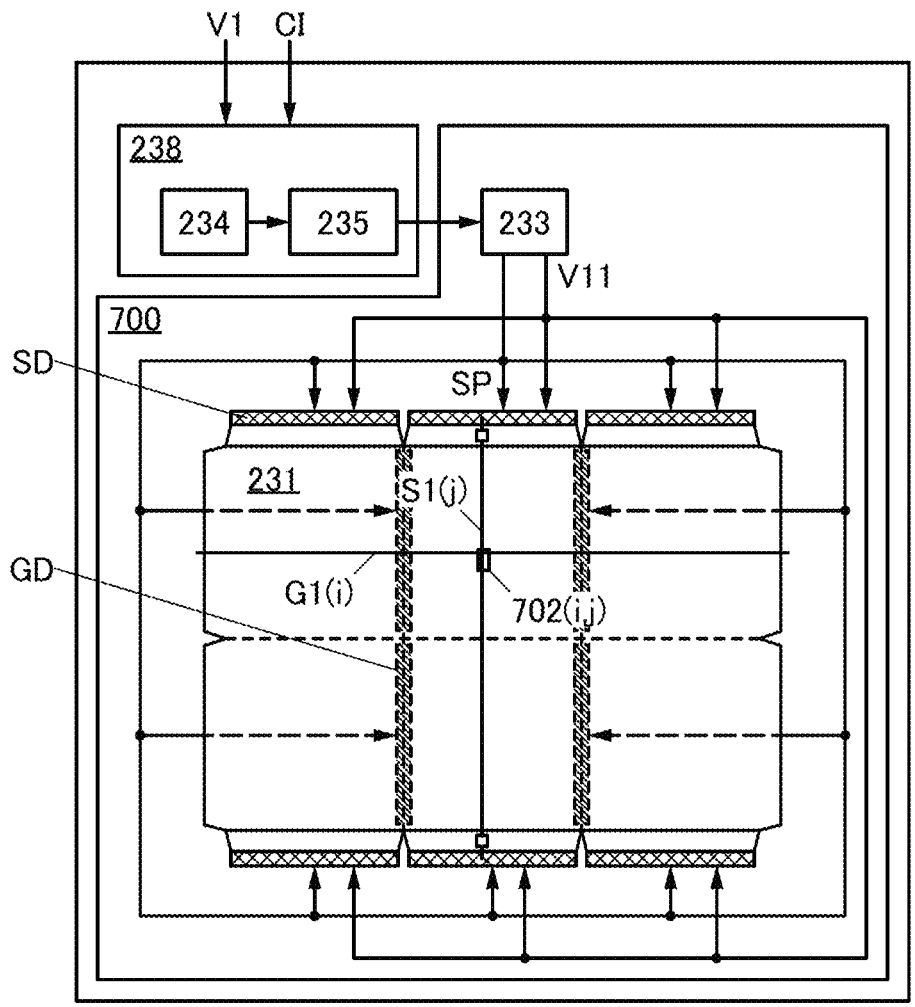
Figure 11A:
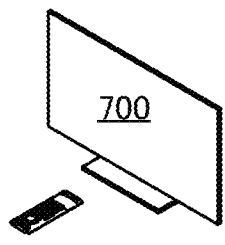
Figure 11A:
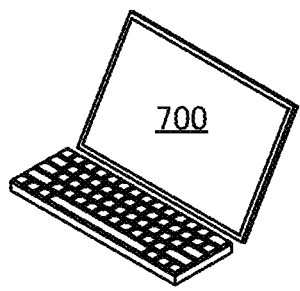
Figure 11A:
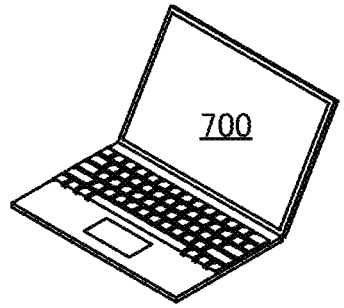

The display device described in this embodiment includes the control portion 238 and the display panel 700 (see FIG. 11(A)).

Structure Example of Control Portion 238

The control portion 238 is supplied with the image data V1 and the control data CI. For example, a clock signal, a timing signal, or the like can be used as the control data CI.

The control portion 238 generates the data V11 on the basis of the image data V1 and generates the control signal SP on the basis of the control data CI. The control portion 238 supplies the data V11 and the control signal SP. The data V11 includes a grayscale of 8 bits or more, preferably 12 bits or more, for example. For example, a clock signal, a start pulse, or the like of a shift register used for a driver circuit can be used as the control signal SP.

Specifically, the control portion 238 includes a control circuit 233, a decompression circuit 234, and an image processing circuit 235.

<<Control Circuit 233>>

The control circuit 233 has a function of generating and supplying the control signal SP.

The control circuit 233 has a function of supplying the control signal SP. For example, a clock signal, a timing signal, or the like can be used as the control signal SP.

A timing controller can be used as the control circuit 233, for example.

<<Decompression Circuit 234>>

The decompression circuit 234 has a function of decompressing the image data V1 supplied in a compressed state. The decompression circuit 234 includes a memory portion. The memory portion has a function of storing decompressed image data, for example.

<<Image Processing Circuit 235>>

The image processing circuit 235 includes a memory region, for example. The memory region has a function of storing data included in the image data V1, for example.

The image processing circuit 235 has a function of generating the data V11 by correcting the image data V1 on the basis of a predetermined characteristic curve and a function of supplying the data V11, for example.

Structure Example of Display Panel

The display panel 700 is supplied with the data V11 and the control signal SP. The driver circuit operates on the basis of the control signal SP, and the pixel 702(i, j) performs display on the basis of the data V11.

For example, the display panel described in Embodiment 1 can be used.

For example, the driver circuit SD is supplied with the control signal SP and the data V11 and supplies the first signal and the second signal. In addition, the driver circuit GD is supplied with the control signal SP and supplies the first selection signal and the second selection signal.

Using the control signal SP enables a synchronized operation of the driver circuit SD and the driver circuit GD.

Note that the control circuit 233 can be included in the display panel. For example, the control circuit 233 mounted on a rigid substrate can be used for the display panel. Specifically, the control circuit 233 mounted on the rigid substrate can be electrically connected to the driver circuit with the use of a flexible printed circuit.

Thus, the image data can be displayed using the display element. As a result, a novel display device that is highly convenient or reliable can be provided. Alternatively, for example, a television receiver system (see FIG. 11(B-1)), a video monitor (see FIG. 11(B-2)), a laptop computer (see FIG. 11(B-3)), or the like can be provided.

Note that this embodiment can be combined with other embodiments in this specification as appropriate.

Embodiment 4

In this embodiment, a structure of an input/output device of one embodiment of the present invention will be described with reference to FIG. 12.

Figure 12:
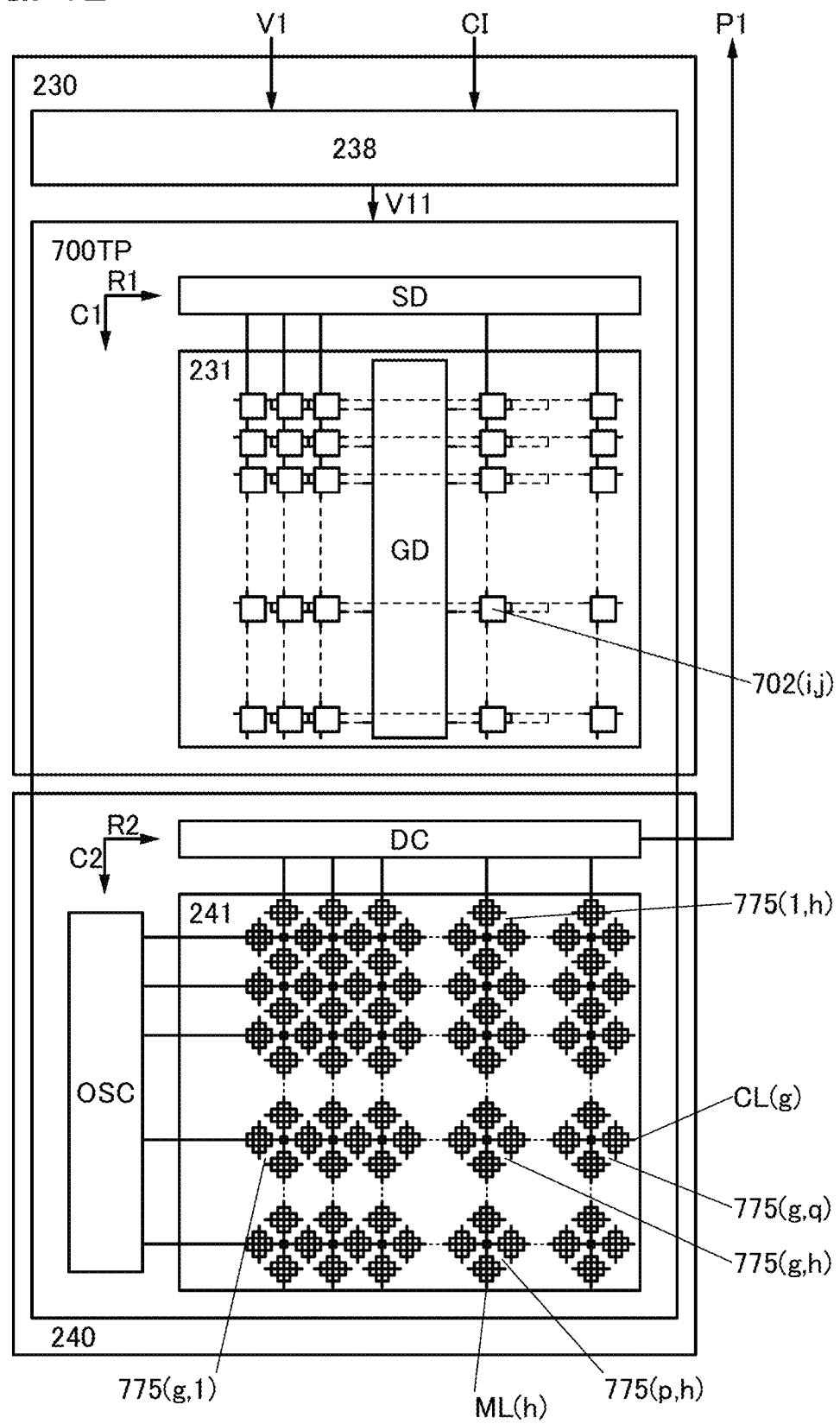
FIG. 12 is a view showing an input/output device of an embodiment.

FIG. 12 is a block diagram showing the structure of the input/output device of one embodiment of the present invention.

Structure Example of Input/Output Device

The input/output device described in this embodiment includes the input portion 240 and the display portion 230 (see FIG. 12).

<<Display Portion 230>>

For example, the display panel 700 described in Embodiment 1 can be used for the display portion 230. Note that a panel having a structure including the input portion 240 and the display portion 230 can be referred to as an input/output panel 700TP.

Structure Example 1 of Input Portion 240

The input portion 240 includes the sensing region 241. The input portion 240 has a function of sensing an object approaching the sensing region 241.

The sensing region 241 includes a region overlapping with the pixel 702(i, j).

Thus, the object approaching the region overlapping with the display portion can be sensed while image data is displayed by the display portion. Alternatively, a finger or the like that approaches the display portion can be used as a pointer to input positional data. Alternatively, positional data can be associated with image data displayed on the display portion. As a result, a novel input/output device that is highly convenient or reliable can be provided.

Structure Example 2 of Input Portion 240

The input portion 240 can include an oscillation circuit OSC and a sensing circuit DC (see FIG. 12).

<<Sensing Region 241>>

The sensing region 241 includes one or more sensing elements, for example.

The sensing region 241 includes a group of sensing elements 775(g, 1) to 775(g, q) and a different group of sensing elements 775(1, h) to 775(p, h). Note that g is an integer greater than or equal to 1 and less than or equal to p, h is an integer greater than or equal to 1 and less than or equal to q, and p and q are each an integer greater than or equal to 1.

The group of sensing elements 775(g, 1) to 775(g, q) include a sensing element 775(g, h) and are provided in the row direction (the direction indicated by an arrow R2 in the drawing). Note that the direction indicated by the arrow R2 may be the same as or different from the direction indicated by the arrow R1.

The different group of sensing elements 775(1, h) to 775(p, h) include the sensing element 775(g, h) and are provided in the column direction (the direction indicated by an arrow C2 in the drawing) that intersects the row direction.

<<Sensing Element>>

The sensing element has a function of sensing an approaching pointer. For example, a finger, a stylus pen, or the like can be used as the pointer. For example, a piece of metal, a coil, or the like can be used for the stylus pen.

Specifically, a capacitive proximity sensor, an electromagnetic inductive proximity sensor, an optical proximity sensor, a resistive proximity sensor, or the like can be used as the sensing element.

A plurality of types of sensing elements can be used in combination. For example, a sensing element that senses a finger and a sensing element that senses a stylus pen can be used in combination.

This allows determination of the kind of a pointer. Alternatively, different instructions can be associated with pieces of sensing data depending on the kind of a pointer that has been determined. Specifically, in the case where it is determined that a finger is used as a pointer, sensing data can be associated with a gesture. Alternatively, in the case where it is determined that a stylus pen is used as a pointer, sensing data can be associated with drawing processing.

Specifically, a capacitive proximity sensor or an optical proximity sensor can be used to sense a finger. Alternatively, an electromagnetic inductive proximity sensor or an optical proximity sensor can be used to sense a stylus pen.

Note that this embodiment can be combined with other embodiments in this specification as appropriate.

Embodiment 5

In this embodiment, a structure of a data processing device of one embodiment of the present invention will be described with reference to FIG. 13 to FIG. 15.

Figure 13A:
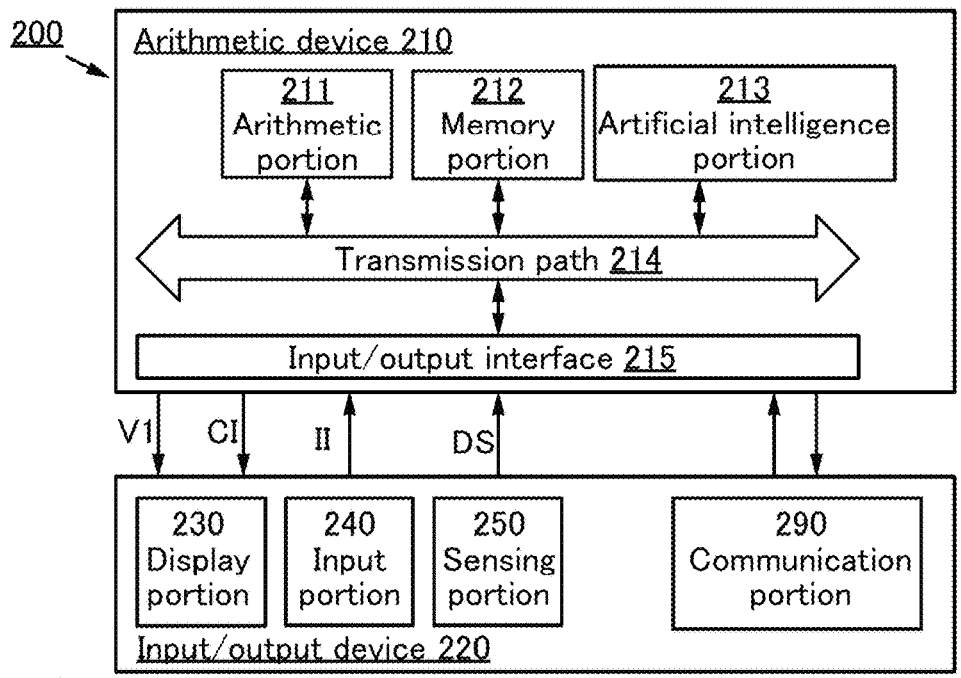
FIGS. 13A-13C are views showing a data processing device of an embodiment.
Figure 13B:
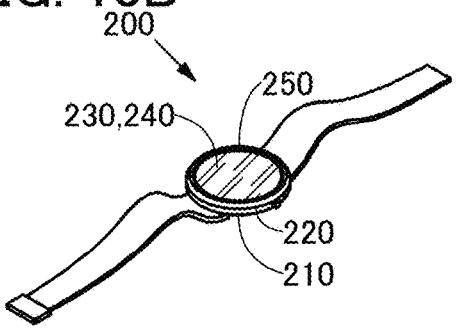
Figure 13C:
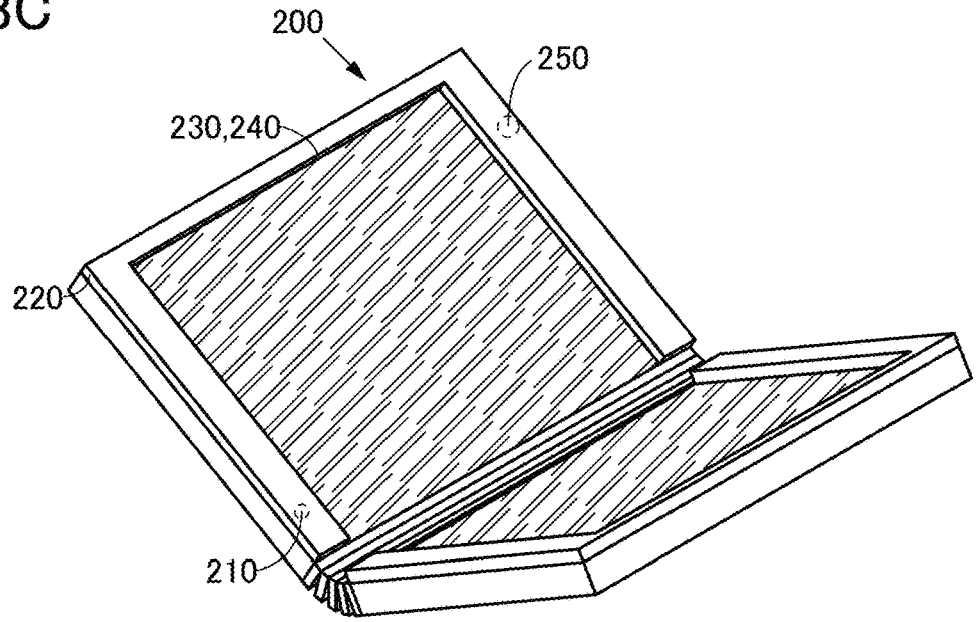

FIG. 13(A) is a block diagram showing the structure of the data processing device of one embodiment of the present invention. FIG. 13(B) and FIG. 13(C) are projection views showing examples of the appearance of the data processing device.

Figure 14A:
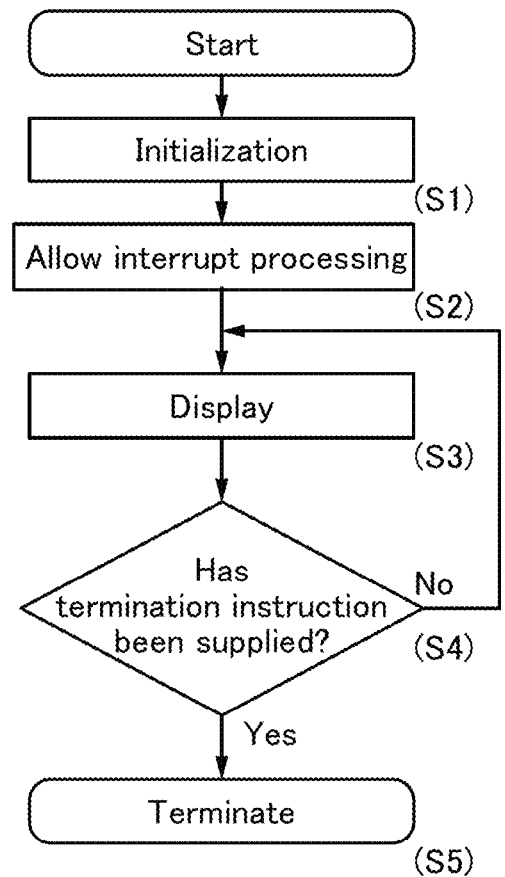
FIGS. 14A and 14B are flow charts showing a program of an embodiment.
Figure 14B:
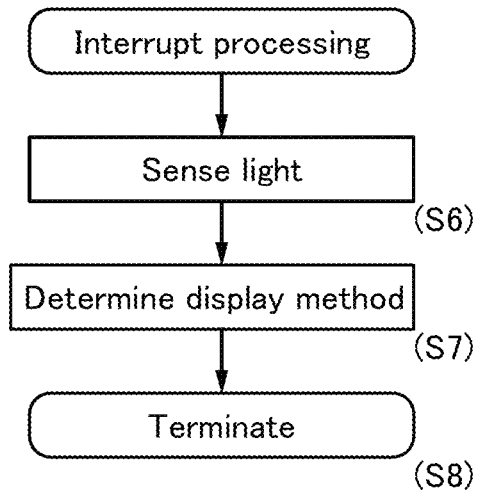

FIG. 14 is a flow chart showing a program of one embodiment of the present invention. FIG. 14(A) is a flow chart showing main processing of the program of one embodiment of the present invention, and FIG. 14(B) is a flow chart showing interrupt processing.

FIG. 15 shows the program of one embodiment of the present invention. FIG. 15(A) is a flow chart showing interrupt processing of the program of one embodiment of the present invention. FIG. 15(B) is a schematic view showing operation of the data processing device, and FIG. 15(C) is a timing chart showing operation of the data processing device of one embodiment of the present invention.

Structure Example 1 of Data Processing Device

A data processing device described in this embodiment includes an arithmetic device 210 and an input/output device 220 (see FIG. 13(A)). Note that the input/output device is electrically connected to the arithmetic device 210. A data processing device 200 can also include a housing (see FIG. 13(B) or FIG. 13(C)).

Structure Example 1 of Arithmetic Device 210

The arithmetic device 210 is supplied with the input data II or the sensing data DS. The arithmetic device 210 supplies the control data CI and the image data V1.

The arithmetic device 210 includes an arithmetic portion 211 and a memory portion 212. The arithmetic device 210 includes a transmission path 214 and an input/output interface 215.

The transmission path 214 is electrically connected to the arithmetic portion 211, the memory portion 212, and the input/output interface 215.
<<Arithmetic Portion 211>>

The arithmetic portion 211 has a function of executing a program, for example.
<<Memory Portion 212>>

The memory portion 212 has a function of storing, for example, the program executed by the arithmetic portion 211, initial data, setting data, an image, or the like.

Specifically, a hard disk, a flash memory, a memory using a transistor including an oxide semiconductor, or the like can be used as the memory portion 212.
<<Input/Output Interface 215 and Transmission Path 214>>

The input/output interface 215 includes a terminal or a wiring and has a function of supplying data and being supplied with data. The input/output interface 215 can be electrically connected to the transmission path 214, for example. The input/output interface 215 can also be electrically connected to the input/output device 220.

The transmission path 214 includes a wiring and has a function of supplying data and being supplied with data. The transmission path 214 can be electrically connected to the input/output interface 215, for example. The transmission path 214 can also be electrically connected to the arithmetic portion 211, the memory portion 212, or the input/output interface 215.

Structure Example of Input/Output Device 220

The input/output device 220 supplies the input data II and the sensing data DS. The input/output device 220 is supplied with the control data CI and the image data V1 (see FIG. 13(A)).

As the input data II, for example, a scan code of a keyboard, positional data, operation data of buttons, sound data, image data, or the like can be used. Alternatively, for example, illuminance data, attitude data, acceleration data, bearing data, pressure data, temperature data, humidity data, or the like of an environment where the data processing device 200 is used, or the like can be used as the sensing data DS.

As the control data CI, for example, a signal controlling the luminance of display of the image data V1, a signal controlling the chroma of display of the image data V1, or a signal controlling the hue of display of the image data V1 can be used. Alternatively, a signal that changes display of part of the image data V1 can be used as the control data CI.

The input/output device 220 includes the display portion 230, the input portion 240, and a sensing portion 250. For example, the input/output device described in Embodiment 4 can be used.

The display portion 230 displays the image data V1 on the basis of the control data CI.

The input portion 240 generates the input data II.

The sensing portion 250 generates the sensing data DS.
<<Display Portion 230>>

The display portion 230 has a function of displaying an image on the basis of the image data V1. The display portion 230 has a function of displaying an image on the basis of the control data CI.

The display portion 230 includes the control portion 238, a driver circuit GD, a driver circuit SD, and the display panel 700 (see FIG. 11). For example, the display device described in Embodiment 3 can be used for the display portion 230.
<<Input Portion 240>>

The input portion 240 has a function of supplying positional data P1. A variety of human interfaces or the like can be used for the input portion 240 (see FIG. 13(A)).

For example, a keyboard, a mouse, a touch sensor, a microphone, a camera, or the like can be used as the input portion 240. Note that a touch sensor including a region overlapping with the display portion 230 can be used. An input/output device including the display portion 230 and a touch sensor including a region overlapping with the display portion 230 can be referred to as a touch panel or a touch screen.

A user can make various gestures (tap, drag, swipe, pinch in, and the like) using his/her finger touching the touch panel as a pointer, for example.

The arithmetic device 210, for example, analyzes data on the position, path, or the like of the finger in contact with the touch panel and can determine that a specific gesture is supplied when the analysis results meet predetermined conditions. Thus, the user can supply a predetermined operation instruction associated with the predetermined gesture in advance by using the gesture.

For instance, the user can supply a "scroll instruction" for changing the display position of image data by using a gesture of moving the finger in contact with the touch panel along the touch panel.

<<Sensing Portion 250>>

The sensing portion 250 has a function of supplying the sensing data DS. The sensing portion 250 has a function of sensing the illuminance of the environment where the data processing device 200 is used and a function of supplying illuminance data, for example.

The sensing portion 250 has a function of sensing the ambient conditions and supplying the sensing data. Specifically, the sensing portion 250 can supply illuminance data, attitude data, acceleration data, bearing data, pressure data, temperature data, humidity data, or the like.

For example, a photosensor, an attitude sensor, an acceleration sensor, a direction sensor, a GPS (Global positioning System) signal receiving circuit, a pressure sensor, a temperature sensor, a humidity sensor, a camera, or the like can be used as the sensing portion 250.

<<Communication Portion 290>>

A communication portion 290 has a function of supplying data to a network and obtaining data from the network.

<<Housing>>

Note that the housing has a function of storing the input/output device 220 or the arithmetic device 210. Alternatively, the housing has a function of supporting the display portion 230 or the arithmetic device 210.

Thus, the data processing device can determine the intensity of light received by the housing of the data processing device and operate under the usage environment of the data processing device. Alternatively, a user of the data processing device can select a display method. As a result, a novel data processing device that is highly convenient or reliable can be provided.

Note that in some cases, these components cannot be clearly distinguished from each other and one component may also serve as another component or include part of another component. For example, a touch panel in which a touch sensor overlaps with a display panel is an input portion as well as a display portion.

Structure Example 2 of Arithmetic Device 210

The arithmetic device 210 includes an artificial intelligence portion 213 (see FIG. 13(A)). The artificial intelligence portion 213 generates the control data CI on the basis of the input data II or the sensing data DS.

[Natural Language Processing on Input Data II]

Specifically, the artificial intelligence portion 213 can perform natural language processing on the input data II to extract one feature from the whole input data II. For example, the artificial intelligence portion 213 can infer emotion or the like put in the input data II, which can be a feature. The artificial intelligence portion 213 can infer the color, design, font, or the like empirically felt suitable for the feature. The artificial intelligence portion 213 can generate data specifying the color, design, or font of a letter or data specifying the color or design of the background, and the data can be used as the control data CI.

Specifically, the artificial intelligence portion 213 can perform natural language processing on the input data II to extract some words included in the input data II. For example, the artificial intelligence portion 213 can extract expressions including a grammatical error, a factual error, emotion, and the like. The artificial intelligence portion 213 can generate and use the control data CI for display of extracted part in the color, design, font, or the like different from those of another part.

[Image Processing on Input Data II]

Specifically, the artificial intelligence portion 213 can perform image processing on the input data II to extract one feature from the input data II. For example, the artificial intelligence portion 213 can infer the age where an image of the input data II is taken, whether the image is taken indoors or outdoors, whether the image is taken in the daytime or at night, or the like, which can be a feature. The artificial intelligence portion 213 can infer the color tone empirically felt suitable for the feature and generate the control data CI for use of the color tone for display. Specifically, data specifying color (e.g., full color, monochrome, or sepia) used for expression of a gradation can be used as the control data CI.

Specifically, the artificial intelligence portion 213 can perform image processing on the input data II to extract some images included in the input data II. For example, the artificial intelligence portion 213 can generate the control data CI for display of a boundary between extracted part of the image and another part. Specifically, the artificial intelligence portion 213 can generate the control data CI for display of a rectangle surrounding the extracted part of the image.

[Inference Using Sensing Data DS]

Specifically, the artificial intelligence portion 213 can generate an inference RI with the use of the sensing data DS as data IN. Alternatively, the artificial intelligence portion 213 can generate the control data CI on the basis of the inference RI so that the user of the data processing device 200 can feel comfortable.

Specifically, the artificial intelligence portion 213 can generate the control data CI for adjustment of display brightness on the basis of the ambient illuminance or the like so that the display brightness can be felt comfortable. Alternatively, the artificial intelligence portion 213 can generate the control data CI for adjustment of volume on the basis of the ambient noise or the like so that the volume can be felt comfortable.

As the control data CI, a clock signal, a timing signal, or the like that is supplied to the control portion 238 included in the display portion 230 can be used. Alternatively, a clock signal, a timing signal, or the like that is supplied to the input portion 240 can be used as the control data CI.

Structure Example 3 of Data Processing Device

Another structure of the data processing device of one embodiment of the present invention is described with reference to FIG. 14(A) and FIG. 14(B).

Program

The program of one embodiment of the present invention has the following steps (see FIG. 14(A)).

[First Step]

In a first step, setting is initialized (see (S1) in FIG. 14(A)).

For example, predetermined image data which is to be displayed on start-up and data for determining a predetermined mode of displaying the image data and a predetermined display method for displaying the image data are acquired from the memory portion 212. Specifically, one still image data or another moving image data can be used as the predetermined image data. Furthermore, a first mode or a second mode can be used as the predetermined mode.
[Second Step]

In a second step, interrupt processing is allowed (see (S2) in FIG. 14(A)). Note that an arithmetic device allowed to execute the interrupt processing can perform the interrupt processing in parallel with the main processing. The arithmetic device that has returned from the interrupt processing to the main processing can reflect the results obtained through the interrupt processing in the main processing.

The arithmetic device may execute the interrupt processing when a counter has an initial value, and the counter may be set at a value other than the initial value when the arithmetic device returns from the interrupt processing. Thus, the interrupt processing can always follow the start-up of the program.
[Third Step]

In a third step, image data is displayed by a predetermined mode or a predetermined display method selected in the first step or the interrupt processing (see (S3) in FIG. 14(A)). Note that the predetermined mode determines a mode of displaying the data, and the predetermined display method determines a method for displaying the image data. For example, the image data V1 can be used as data to be displayed.

One method for displaying the image data V1 can be associated with the first mode, for example. Alternatively, another method for displaying the image data V1 can be associated with the second mode. Thus, a display method can be selected on the basis of the selected mode.

First Mode

Specifically, a method for supplying selection signals to a scan line at a frequency of 30 Hz or higher, preferably 60 Hz or higher, and performing display on the basis of the selection signals can be associated with the first mode.

For example, when selection signals are supplied at a frequency of 30 Hz or higher, preferably 60 Hz or higher, the movement of a moving image can be smoothly displayed.

For example, when an image is refreshed at a frequency of 30 Hz or higher, preferably 60 Hz or higher, an image that changes so as to smoothly follow the user's operation can be displayed on the data processing device 200 which is being operated by the user.

Second Mode

Specifically, a method for supplying selection signals to a scan line at a frequency lower than 30 Hz, preferably lower than 1 Hz, further preferably less than once a minute, and performing display on the basis of the selection signals can be associated with the second mode.

The supply of selection signals at a frequency lower than 30 Hz, preferably lower than 1 Hz, further preferably less than once a minute enables display with a flicker or flickering suppressed. Furthermore, the power consumption can be reduced.

For example, when the data processing device 200 is used for a clock, the display can be refreshed at a frequency of once a second, once a minute, or the like.

Note that when a light-emitting element is used as the display element, for example, the light-emitting element can be configured to emit light in a pulsed manner so that image data is displayed. Specifically, an organic EL element can be configured to emit light in a pulsed manner, and its afterglow can be used for display. The organic EL element has excellent frequency characteristics; thus, time for driving the light-emitting element can be shortened, and thus the power consumption can be reduced in some cases. Alternatively, heat generation is inhibited; thus, the deterioration of the light-emitting element can be suppressed in some cases.
[Fourth Step]

In a fourth step, selection is performed such that the program proceeds to a fifth step when a termination instruction has been supplied, whereas the program proceeds to the third step when the termination instruction has not been supplied (see (S4) in FIG. 14(A)).

For example, the termination instruction supplied in the interrupt processing may be used for the determination.
[Fifth Step]

In the fifth step, the program terminates (see (S5) in FIG. 14(A)).
<<Interrupt Processing>>

The interrupt processing includes a sixth step to an eighth step described below (see FIG. 14(B)).
[Sixth Step]

In the sixth step, the illuminance of the environment where the data processing device 200 is used is sensed using the sensing portion 250, for example (see (S6) in FIG. 14(B)). Note that color temperature or chromaticity of ambient light may be sensed instead of the illuminance of the environment.
[Seventh Step]

In the seventh step, a display method is determined on the basis of the sensed illuminance data (see (S7) in FIG. 14(B)). For example, a display method is determined such that the brightness of display is not too dark or too bright.

Note that in the case where the color temperature of the ambient light or the chromaticity of the ambient light is sensed in the sixth step, the color of display may be adjusted.
[Eighth Step]

In the eighth step, the interrupt processing terminates (see (S8) in FIG. 14(B)).

Structure Example 3 of Data Processing Device

Another structure of the data processing device of one embodiment of the present invention is described with reference to FIG. 15.

FIG. 15(A) is a flow chart showing a program of one embodiment of the present invention. FIG. 15(A) is a flow chart showing interrupt processing different from the interrupt processing shown in FIG. 14(B).

Note that the structure example 3 of the data processing device is different from the interrupt processing described with reference to FIG. 14(B) in that the interrupt processing includes a step of changing a mode on the basis of a supplied predetermined event. Different portions will be described in detail here, and refer to the above description for portions that can use similar structures.
<<Interrupt Processing>>

The interrupt processing includes a sixth step to an eighth step described below (see FIG. 15(A)).
[Sixth Step]

In the sixth step, the program proceeds to the seventh step when a predetermined event has been supplied, whereas the program proceeds to the eighth step when the predetermined event has not been supplied (see (U6) in FIG. 15(A)). For example, whether the predetermined event is supplied in a predetermined period or not can be used as a condition. Specifically, the predetermined period can be longer than 0 seconds, and shorter than or equal to 5 seconds, shorter than or equal to 1 second, or shorter than or equal to 0.5 seconds, preferably shorter than or equal to 0.1 seconds.

[Seventh Step]

In the seventh step, the mode is changed (see (U7) in FIG. 15(A)). Specifically, the second mode is selected in the case where the first mode has been selected, and the first mode is selected in the case where the second mode has been selected.

For example, it is possible to change the display mode of a region that is part of the display portion 230. Specifically, the display mode of a region where one driver circuit in the display portion 230 including the driver circuit GDA, the driver circuit GDB, and a driver circuit GDC supplies a selection signal can be changed (see FIG. 15(B)).

For example, the display mode of the region where a selection signal is supplied from the driver circuit GDB can be changed when a predetermined event is supplied to the input portion 240 in a region overlapping with the region where a selection signal is supplied from the driver circuit GDB (see FIG. 15(B) and FIG. 15(C)). Specifically, the frequency of supply of the selection signal from the driver circuit GDB can be changed in accordance with a "tap" event supplied to a touch panel with a finger or the like.

A signal GCLK is a clock signal controlling the operation of the driver circuit GDB, and a signal PWC1 and a signal PWC2 are pulse width control signals controlling the operation of the driver circuit GDB. The driver circuit GDB supplies selection signals to a scan line G1($m$+1) to a scan line G1($2m$) on the basis of the signal GCLK, the signal PWC1, the signal PWC2, and the like.

Thus, for example, the driver circuit GDB can supply a selection signal without supply of selection signals from the driver circuit GDA and the driver circuit GDC. Alternatively, the display of the region where a selection signal is supplied from the driver circuit GDB can be refreshed without any change in the display of regions where selection signals are supplied from the driver circuit GDA and the driver circuit GDC. Alternatively, power consumed by the driver circuits can be reduced.

[Eighth Step]

In the eighth step, the interrupt processing terminates (see (U8) in FIG. 15(A)). Note that in a period in which the main processing is executed, the interrupt processing may be repeatedly executed.

<<Predetermined Event>>

For example, it is possible to use events supplied using a pointing device such as a mouse, such as "click" and "drag", and events supplied to a touch panel with a finger or the like used as a pointer, such as "tap", "drag", and "swipe".

For example, the position of a slide bar pointed by a pointer, the swipe speed, and the drag speed can be used to assign arguments to an instruction associated with a predetermined event.

For example, data sensed by the sensing portion 250 is compared with a predetermined threshold value, and the compared results can be used for the event.

Specifically, a pressure sensor or the like in contact with a button or the like that is provided so as to be pushed in a housing can be used for the sensing portion 250.

<<Instruction Associated with Predetermined Event>>

For example, the termination instruction can be associated with a specific event.

For example, "page-turning instruction" for switching display from one displayed image data to another image data can be associated with a predetermined event. Note that an argument determining the page-turning speed or the like, which is used when the "page-turning instruction" is executed, can be supplied using the predetermined event.

For example, "scroll instruction" for moving the display position of displayed part of image data and displaying another part continuing from that part, or the like can be associated with a predetermined event. Note that an argument determining the moving speed of display, or the like, which is used when the "scroll instruction" is executed, can be supplied using the predetermined event.

For example, an instruction for setting the display method, an instruction for generating image data, or the like can be associated with a predetermined event. Note that an argument determining the brightness of a generated image can be associated with a predetermined event. An argument determining the brightness of a generated image may be determined on the basis of ambient brightness sensed by the sensing portion 250.

For example, an instruction for acquiring data distributed via a push service using the communication portion 290 or the like can be associated with a predetermined event.

Note that positional data sensed by the sensing portion 250 may be used for the determination of the presence or absence of a qualification for acquiring data. Specifically, it may be determined that there is a qualification for acquiring data in the case of presence in a predetermined class room, school, conference room, company, building, or the like or in a predetermined region. Thus, for example, educational materials distributed in a classroom of a school, a university, or the like can be received, so that the data processing device 200 can be used as a schoolbook or the like (see FIG. 13(C)). Alternatively, materials distributed in a conference room in, for example, a company can be received and used for a conference material.

Note that this embodiment can be combined with other embodiments in this specification as appropriate.

Embodiment 6

In this embodiment, structures of a data processing device of one embodiment of the present invention are described with reference to FIG. 16 and FIG. 17.

FIG. 16 and FIG. 17 are views showing structures of the data processing device of one embodiment of the present invention. FIG. 16(A) is a block diagram of the data processing device, and FIG. 16(B) to FIG. 16(E) are perspective views showing structures of the data processing device. FIG. 17(A) to FIG. 17(E) are perspective views showing structures of the data processing device.

<Data Processing Device>

Figure 16A:
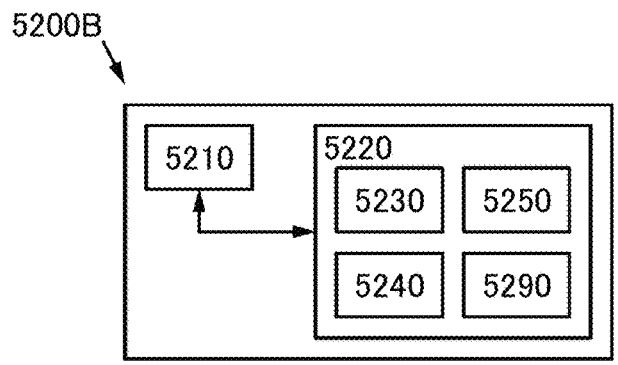
FIGS. 16A-16E are views showing a data processing device of an embodiment.

A data processing device 5200B described in this embodiment includes an arithmetic device 5210 and an input/output device 5220 (see FIG. 16(A)).

The arithmetic device 5210 has a function of being supplied with operation data and a function of supplying image data on the basis of the operation data.

The input/output device 5220 includes a display portion 5230, an input portion 5240, a sensing portion 5250, and a communication portion 5290 and has a function of supplying operation data and a function of being supplied with image data. The input/output device 5220 also has a function of supplying sensing data, a function of supplying communication data, and a function of being supplied with communication data.

The input portion 5240 has a function of supplying operation data. For example, the input portion 5240 supplies operation data on the basis of operation by a user of the data processing device 5200B.

Specifically, a keyboard, a hardware button, a pointing device, a touch sensor, an illuminance sensor, an imaging device, an audio input device, an eye-gaze input device, an attitude sensing device, or the like can be used as the input portion 5240.

The display portion 5230 includes a display panel and has a function of displaying image data. For example, the display panel described in Embodiment 1 can be used for the display portion 5230.

The sensing portion 5250 has a function of supplying sensing data. For example, the sensing portion 5250 has a function of sensing a surrounding environment where the data processing device is used and supplying sensing data.

Specifically, an illuminance sensor, an imaging device, an attitude sensing device, a pressure sensor, a human motion sensor, or the like can be used as the sensing portion 5250.

The communication portion 5290 has a function of being supplied with communication data and a function of supplying communication data. For example, the communication portion 5290 has a function of being connected to another electronic device or a communication network through wireless communication or wired communication. Specifically, the communication portion 5290 has a function of wireless local area network communication, telephone communication, or near field communication, for example.

Structure Example 1 of Data Processing Device

Figure 16B:
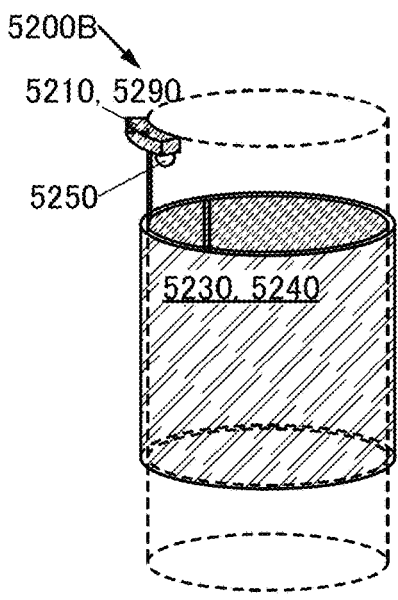

For example, the display portion 5230 can have an outer shape along a cylindrical column (see FIG. 16(B)). The data processing device has a function of changing its display method in accordance with the illuminance of a usage environment. In addition, the data processing device has a function of changing the displayed content in response to sensed existence of a person. This allows the data processing device to be provided on a column of a building, for example. The data processing device can display advertising, guidance, or the like. The data processing device can be used for digital signage or the like.

Structure Example 2 of Data Processing Device

Figure 16C:
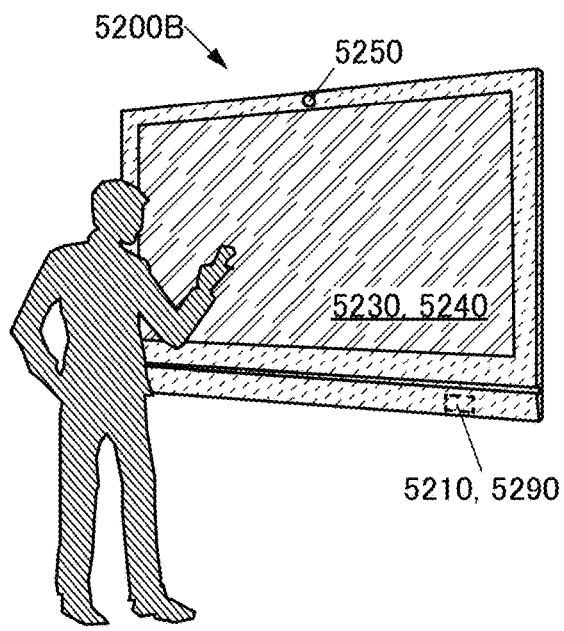

For example, the data processing device has a function of generating image data on the basis of the path of a pointer used by a user (see FIG. 16(C)). Specifically, the display panel with a diagonal size of 20 inches or longer, preferably 40 inches or longer, further preferably 55 inches or longer can be used. Alternatively, a plurality of display panels can be arranged and used as one display region. Alternatively, a plurality of display panels can be arranged and used as a multiscreen. Thus, the data processing device can be used for an electronic blackboard, an electronic bulletin board, or digital signage, for example.

Structure Example 3 of Data Processing Device

Figure 16D:
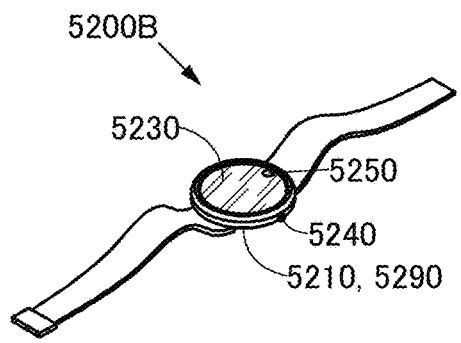

For example, the data processing device has a function of changing its display method in accordance with the illuminance of a usage environment (see FIG. 16(D)). Thus, for example, the power consumption of a smartwatch can be reduced. Alternatively, for example, a smartwatch can display an image so as to be suitably used even in an environment under strong external light, e.g., outdoors in fine weather.

Structure Example 4 of Data Processing Device

Figure 16E:
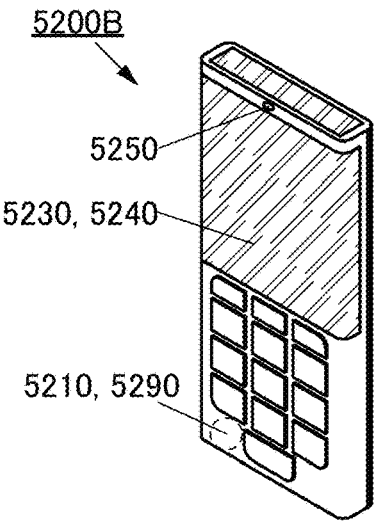

For example, the display portion 5230 has a surface gently curved along a side surface of a housing (see FIG. 16(E)). The display portion 5230 includes a display panel that can display an image on the front surface, the side surfaces, and the top surface, for example. Thus, for example, a mobile phone can display image data not only on its front surface but also on its side surfaces and top surface.

Structure Example 5 of Data Processing Device

Figure 17A:
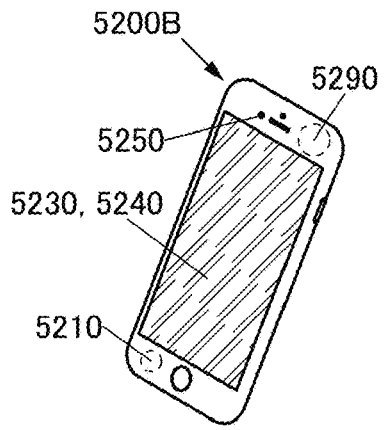
FIGS. 17A-17E are views showing a data processing device of an embodiment.

For example, the data processing device has a function of changing its display method in accordance with the illuminance of a usage environment (see FIG. 17(A)). Thus, the power consumption of a smartphone can be reduced. Alternatively, for example, a smartphone can display an image so as to be suitably used even in an environment under strong external light, e.g., outdoors in fine weather.

Structure Example 6 of Data Processing Device

Figure 17B:
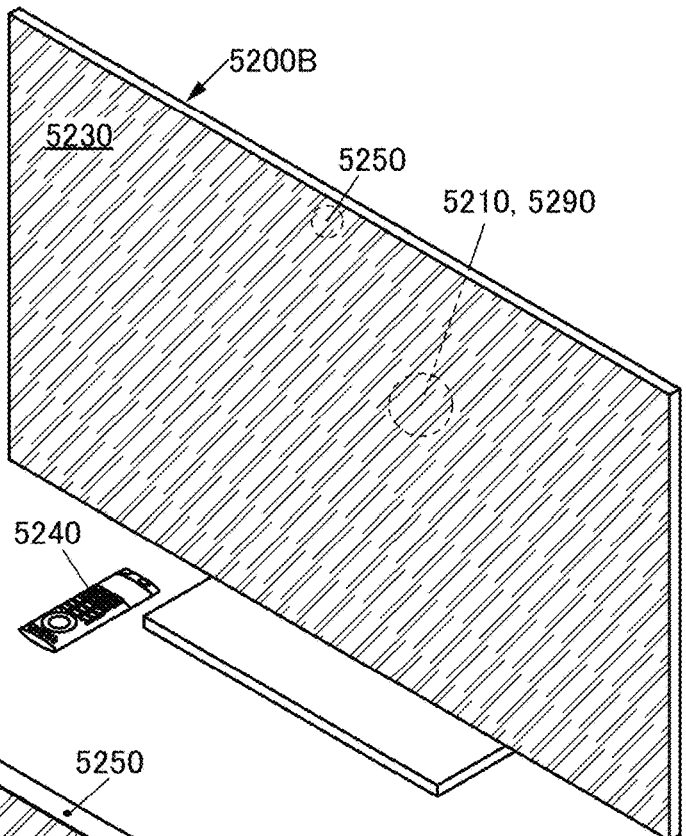

For example, the data processing device has a function of changing its display method in accordance with the illuminance of a usage environment (see FIG. 17(B)). Accordingly, for example, a television system can display an image in such a manner that the television system can be suitably used even when irradiated with strong external light that enters the room from the outside in fine weather.

Structure Example 7 of Data Processing Device

Figure 17C:
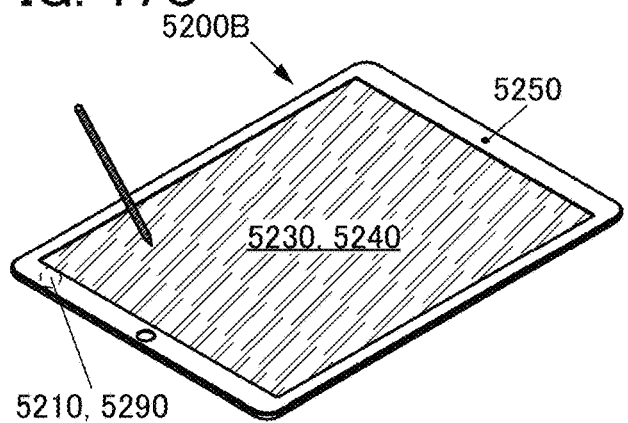

For example, the data processing device has a function of changing its display method in accordance with the illuminance of a usage environment (see FIG. 17(C)). Thus, for example, a tablet computer can display an image so as to be suitably used even in an environment under strong external light, e.g., outdoors in fine weather.

Structure Example 8 of Data Processing Device

Figure 17D:
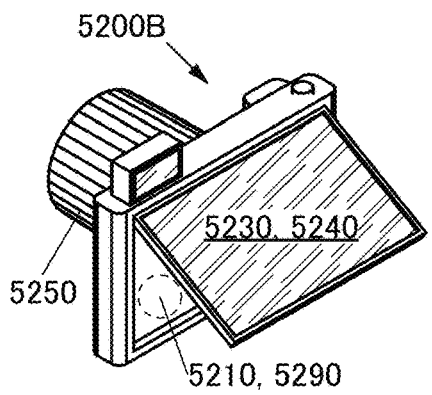

For example, the data processing device has a function of changing its display method in accordance with the illuminance of a usage environment (see FIG. 17(D)). Accordingly, for example, a digital camera can display a subject in such a manner that an image is favorably viewed even in an environment under strong external light, e.g., outdoors in fine weather.

Structure Example 9 of Data Processing Device

Figure 17E:
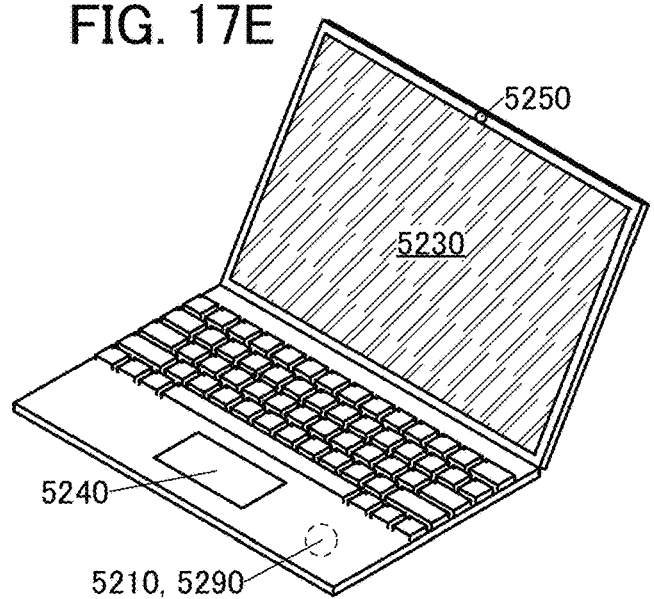

For example, the data processing device has a function of changing its display method in accordance with the illuminance of a usage environment (see FIG. 17(E)). Accordingly, for example, a personal computer can display an image so as to be suitably used even in an environment under strong external light, e.g., outdoors in fine weather.

Note that this embodiment can be combined with other embodiments in this specification as appropriate.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relation, for example, a connection relation shown in drawings or texts, a connection relation other than one shown in drawings or texts is regarded as being disclosed in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y (e.g., a switch, a transistor, a capacitor, an inductor, a resistor, a diode, a display element, a light-emitting element, and a load) provided therebetween.

For example, in the case where X and Y are electrically connected, one or more elements that allow an electrical connection between X and Y (e.g., a switch, a transistor, a capacitor, an inductor, a resistor, a diode, a display element, a light-emitting element, and a load) can be connected between X and Y Note that a switch has a function of being controlled to be turned on or off. That is, a switch has a function of being in a conduction state (on state) or a non-conduction state (off state) to control whether or not current flows. Alternatively, the switch has a function of selecting and changing a current path. Note that the case where X and Y are electrically connected includes the case where X and Y are directly connected.

An example of the case where X and Y are functionally connected is the case where one or more circuits that allow functional connection between X and Y (for example, a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (for example, a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, a control circuit, or the like) can be connected between X and Y For example, even when another circuit is interposed between X and Y, X and Y are functionally connected when a signal output from X is transmitted to Y Note that the case where X and Y are functionally connected includes the case where X and Y are directly connected and the case where X and Y are electrically connected.

Note that in the case where there is an explicit description, X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are disclosed in this specification and the like. That is, in the case where there is an explicit description, being electrically connected, the same contents as the case where there is only an explicit description, being connected, are disclosed in this specification and the like.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y can be expressed as follows.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path through the transistor and between the source (or the first terminal or the like) of the transistor and a drain (or a second terminal or the like) of the transistor, the first connection path is a path through Z1, the drain (or the second terminal or the like) of the transistor is electrically connected to Y through at least a third connection path, the third connection path does not include the second connection path, and the third connection path is a path through Z2" and "a source (or a first terminal or the like) of a transistor is electrically connected to X through Z1 by at least a first connection path, the first connection path does not include a second connection path, the second connection path includes a connection path through the transistor, a drain (or a second terminal or the like) of the transistor is electrically connected to Y through Z2 by at least a third connection path, and the third connection path does not include the second connection path". Still another example of the expression is "a source (or a first terminal or the like) of a transistor is electrically connected to X through Z1 by at least a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through Z2 by at least a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and the expression is not limited to these expressions. Here, X, Y, Z1, and Z2 denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, "electrical connection" in this specification includes in its category such a case where one conductive film has functions of a plurality of components.

REFERENCE NUMERALS

ANO: conductive film, C21: capacitor, CI: control data, DS: sensing data, G1(i): scan line, G2(i): wiring, GCLK: signal, GDA: driver circuit, GDB: driver circuit, GDC: driver circuit, GD: driver circuit, II: input data, IN: data, S(1): signal line, S2(j): auxiliary signal line, SD: driver circuit, SP: control signal, SW2: switch, P1: positional data, PWC1: signal, PWC2: signal, V1: image data, V11: data, VCOM2: conductive film, 200: data processing device, 210: arithmetic device, 211: arithmetic portion, 212: memory portion, 213: artificial intelligence portion, 214: transmission path, 215: input/output interface, 220: input/output device, 230: display portion, 231: display region, 233: control circuit, 234: decompression circuit, 235: image processing circuit, 238: control portion, 240: input portion, 241: sensing region, 248: control portion, 250: sensing portion, 270: input portion, 290: communication portion, 501C: insulating film, 504: conductive film, 506: insulating film, 508: semiconductor film, 510: base, 512A: conductive film, 512B: conductive film, 516: insulating film, 518: insulating film, 519C: terminal, 520A: functional layer, 520B: functional layer, 521: insulating film, 521B: insulating film, 528: insulating film, 530: pixel circuit, 550: display element, 551: electrode, 552: electrode, 553(j): layer containing a light-emitting material, 591A: connection portion, 591C(i, y): connection portion, 591D(j): connection portion, 700: display panel, 700TP: input/output panel, 702: pixel, 720: functional layer, 770: base, 770P: functional film, 771: insulating film, 775: sensing element, 5200B: data processing device, 5210: arithmetic device, 5220: input/output device, 5230: display portion, 5240: input portion, 5250: sensing portion, 5290: communication portion.

This application is based on Japanese Patent Application Serial No. 2018-013242 filed with Japan Patent Office on Jan. 30, 2018, the entire contents of which are hereby incorporated herein by reference.

The invention claimed is:
1. A display panel comprising:
a display region;
a first functional layer;
a second functional layer;
a first connection portion; and
a terminal,
wherein the display region comprises a pixel,
wherein the pixel comprises a display element and a pixel circuit,
wherein the first functional layer comprises the pixel circuit, a scan line, a signal line, an auxiliary signal line, and a second connection portion,
wherein the display element is electrically connected to the pixel circuit,
wherein the pixel circuit is electrically connected to the scan line,
wherein the signal line is electrically connected to the pixel circuit,
wherein the second functional layer comprises a region overlapping with the first functional layer,
wherein the second functional layer comprises a driver circuit and a first wiring,
wherein the driver circuit is provided so that the pixel circuit is positioned between the driver circuit and the display element,
wherein the first wiring is electrically connected to the scan line at the first connection portion,
wherein the first wiring is electrically connected to the driver circuit,
wherein the signal line is electrically connected to the auxiliary signal line at the second connection portion,
wherein the auxiliary signal line comprises a region intersecting another signal line, and
wherein the auxiliary signal line is electrically connected to the terminal.
2. The display panel according to claim 1,
wherein the first wiring comprises a region intersecting the signal line.
3. The display panel according to claim 1,
wherein the pixel comprises a switch, a transistor, and a capacitor,
wherein the transistor comprises a source electrode and a drain electrode,
wherein one of the source electrode and the drain electrode is electrically connected to the display element,
wherein the other of the source electrode and the drain electrode is electrically connected to a second wiring, and
wherein the second wiring comprises a region intersecting the auxiliary signal line.
4. A display device comprising:
the display panel according to claim 1; and
a control portion,
wherein the control portion is supplied with image data and control data,
wherein the control portion generates data on the basis of the image data,
wherein the control portion generates a control signal on the basis of the control data,
wherein the control portion supplies the data and the control signal,
wherein the display panel is supplied with the data and the control signal,
wherein the driver circuit operates on the basis of the control signal, and
wherein the pixel performs display on the basis of the data.
5. An input/output device comprising:
an input portion and a display portion,
wherein the display portion comprises the display panel according to claim 1,
wherein the input portion comprises a sensing region, wherein the input portion senses an object approaching the sensing region, and wherein the sensing region comprises a region overlapping with the pixel.

6. A data processing device comprising:
one or more of a keyboard, a hardware button, a pointing device, a touch sensor, an illuminance sensor, an imaging device, an audio input device, an eye-gaze input device, and an attitude detection device, and the display panel according to claim 1.

* * * * *